United States Patent
Agrawal et al.

(10) Patent No.: US 12,414,339 B2
(45) Date of Patent: Sep. 9, 2025

(54) FORMATION OF GATE SPACERS FOR STRAINED PMOS GATE-ALL-AROUND TRANSISTOR STRUCTURES

(71) Applicant: Intel Corporation, Santa Clara, CA (US)

(72) Inventors: Ashish Agrawal, Hillsboro, OR (US); Gilbert Dewey, Beaverton, OR (US); Siddharth Chouksey, Portland, OR (US); Jack T. Kavalieros, Portland, OR (US); Cheng-Ying Huang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 799 days.

(21) Appl. No.: 17/517,076

(22) Filed: Nov. 2, 2021

(65) Prior Publication Data
US 2023/0139255 A1    May 4, 2023

(51) Int. Cl.
*H10D 62/10* (2025.01)
*H10D 30/67* (2025.01)
*H10D 62/822* (2025.01)
*H10D 84/85* (2025.01)

(52) U.S. Cl.
CPC ....... *H10D 62/119* (2025.01); *H10D 30/6735* (2025.01); *H10D 62/822* (2025.01); *H10D 84/85* (2025.01)

(58) Field of Classification Search
CPC ............ H10D 62/119; H10D 30/6735; H10D 62/822; H10D 84/85; H01L 21/18; H01L 29/0847; H01L 29/0673; H01L 29/161; H01L 29/165; H01L 29/42392; H01L 29/66545; H01L 29/66553; H01L 29/775; H01L 29/7848; H01L 29/78696; H01L 29/66439; B82Y 10/00
USPC ........................................................ 257/347
See application file for complete search history.

(56) References Cited

U.S. PATENT DOCUMENTS

| | | | |
|---|---|---|---|
| 2017/0040321 A1* | 2/2017 | Mitard | H10D 30/6757 |
| 2020/0105755 A1* | 4/2020 | Cea | H01L 29/7842 |
| 2020/0168742 A1* | 5/2020 | Wang | H01L 29/66469 |
| 2020/0273964 A1* | 8/2020 | Lin | H10D 62/116 |

OTHER PUBLICATIONS

Extended European Search Report received for EP Application No. 22198930.4. Mail date: Mar. 9, 2023. 9 pages.

\* cited by examiner

*Primary Examiner* — Eva Y Montalvo
*Assistant Examiner* — Jiyoung Oh
(74) *Attorney, Agent, or Firm* — Finch & Maloney PLLC

(57) ABSTRACT

A gate-all-around transistor device includes a body including a semiconductor material, and a gate structure at least in part wrapped around the body. The gate structure includes a gate electrode and a gate dielectric between the body and the gate electrode. The body is between a source region and a drain region. A first spacer is between the source region and the gate electrode, and a second spacer is between the drain region and the gate electrode. In an example, the first and second spacers include germanium and oxygen. The body can be, for instance, a nanoribbon, nanosheet, or nanowire.

20 Claims, 15 Drawing Sheets

FIG. 1A1

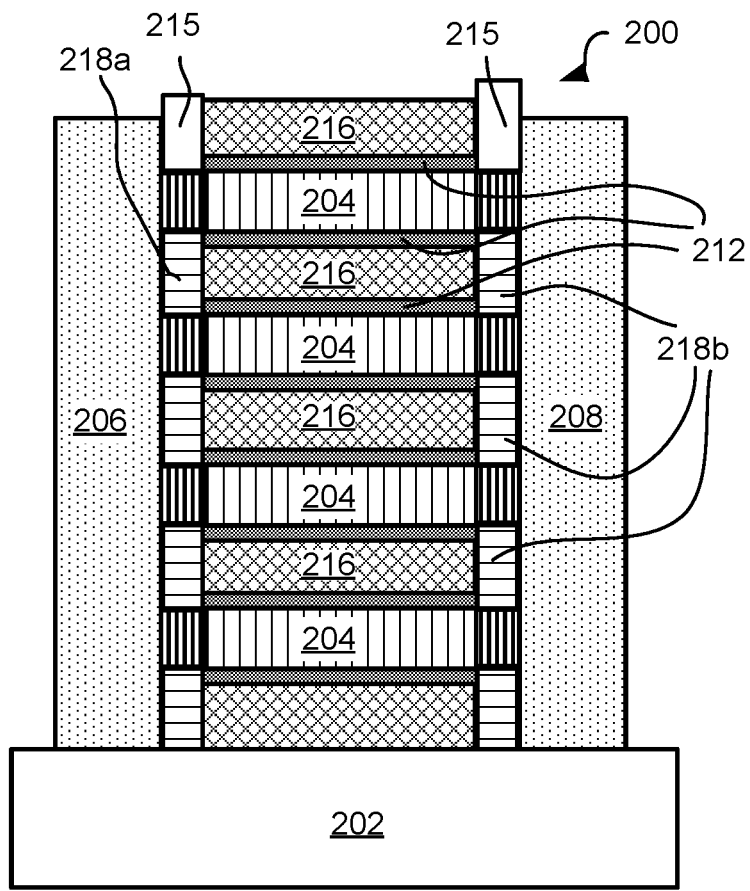
FIG. 2A
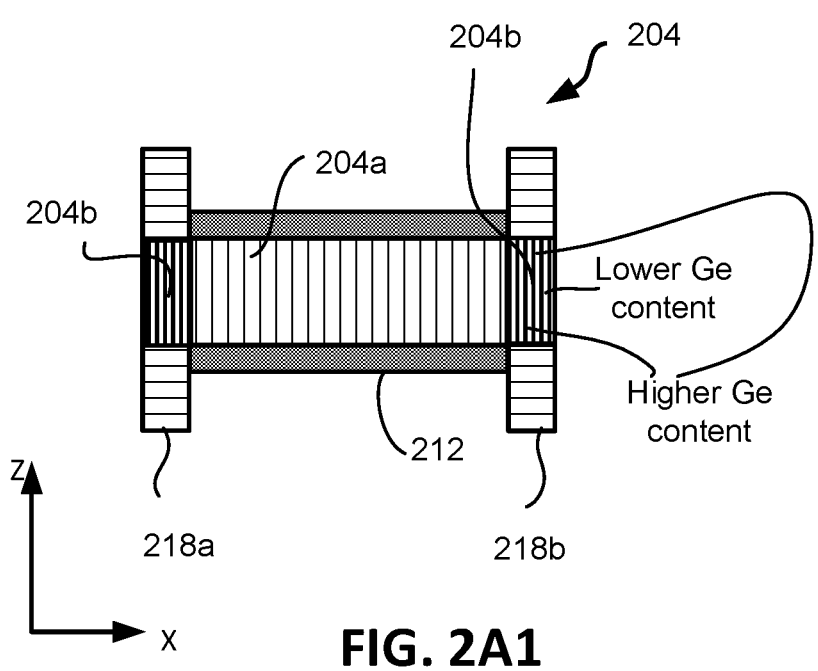
FIG. 2A1

FORMATION OF GATE SPACERS FOR STRAINED PMOS GATE-ALL-AROUND TRANSISTOR STRUCTURES

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device; and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A nanowire transistor (sometimes referred to as a gate-all-around (GAA) or nanoribbon transistor) is configured similarly to a fin-based transistor, but instead of a finned channel region, one or more nanowires extend between the source and the drain regions. In nanowire transistors the gate material wraps around each nanowire (hence, gate-all-around).

BRIEF DESCRIPTION OF THE DRAWINGS

FIG. 1A1 illustrates a structure of a single nanowire of the nanowire semiconductor device of FIGS. 1A and 1B, where the single nanowire has a nanowire middle region extending between nanowire tip regions, in accordance with an embodiment of the present disclosure.

FIG. 2A illustrates a cross-sectional view of another example nanowire semiconductor device.

FIG. 2A1 illustrate a structure of a single nanowire of the nanowire semiconductor device of FIGS. 2A and 2B, having a nanowire middle region extending between nanowire tip regions, in accordance with an embodiment of the present disclosure.

Figure 1A:
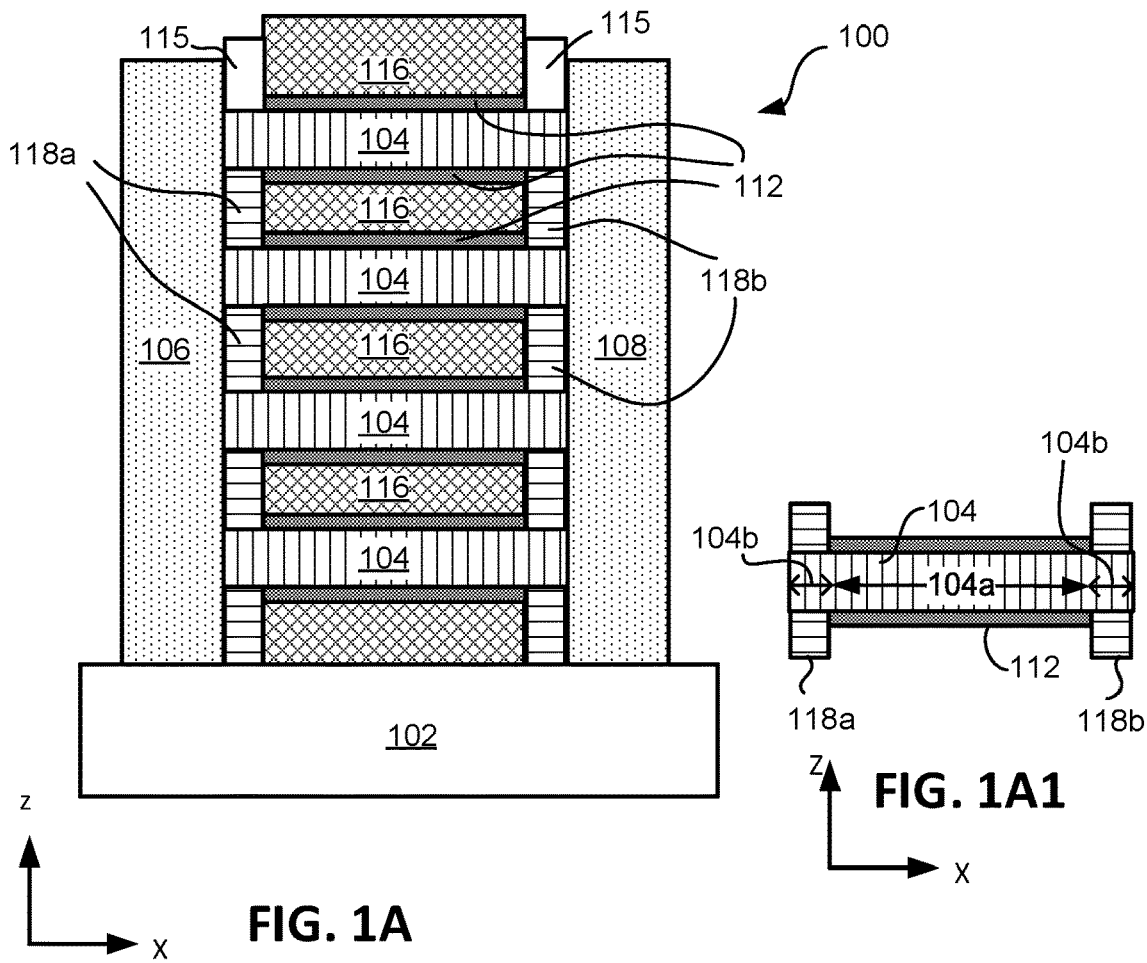
FIG. 1A illustrates a cross-sectional view of an example nanowire semiconductor device.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Integrated circuit structures including PMOS transistors having strained semiconductor bodies (e.g., nanowires) and improved gate spacers (e.g., having dielectric constant of less than 4.2) are provided herein. In one example embodiment, a semiconductor structure comprises a body comprising a semiconductor material, and a gate structure at least in part wrapped around the body, the gate structure including (i) a gate electrode and (ii) a gate dielectric between the body and the gate electrode. The body is between a source region and a drain region. In an example, the body is a strained nanowire, a nanoribbon, or a nanosheet. A first spacer is between the source region and the gate electrode, and a second spacer is between the drain region and the gate electrode. In an example, the first and second spacers comprise germanium and oxygen.

In another example embodiment, a nanowire transistor structure comprises a body comprising a semiconductor material, and a gate structure at least in part wrapped around the body. The gate structure includes (i) a gate electrode and (ii) a gate dielectric between the body and the gate electrode. In an example, the body is a strained nanowire, a nanoribbon, or a nanosheet, and is between a source region and a drain region. In an example, the body comprises a first tip region, a second tip region, and a middle region between the first tip region and the second tip region. In an example, the middle region comprises silicon, and the first and second tip regions comprise silicon and germanium.

In yet another example embodiment, a semiconductor structure comprises a substrate, a P-channel metal-oxide-semiconductor (PMOS) transistor on the substrate, and a N-channel metal-oxide-semiconductor (NMOS) transistor on the substrate. In an example, the PMOS transistor comprises a first body comprising a semiconductor material, a first gate structure at least in part wrapped around the first body, a first source region and a first drain region, a first spacer between the first source region and the first gate structure, and a second spacer between the first drain region and the gate structure. In an example, the NMOS transistor comprises a second body comprising a semiconductor material, a second gate structure at least in part wrapped around the second body, a second source region and a second drain region, a third spacer between the second source region and the second gate structure, and a fourth spacer between the second drain region and the second gate structure. In an example, the first and second spacers comprise germanium, silicon, and oxygen, and are free of nitrogen. In an example, the third and fourth spacers comprise silicon and nitrogen and are free of germanium.

In a further example embodiment, a method of forming a semiconductor device comprises forming a vertical stack of alternating layers of sacrificial material and semiconductor channel material and forming a dummy gate over the vertical stack. Subsequently, a source region and a drain region are formed, where the vertical stack is laterally between the source region and the drain region. An inner wall of the source region is in contact with the vertical stack and an inner wall of the drain region is in contact with the vertical stack. The dummy gate and sacrificial materials are removed, thereby (i) exposing at least a part of the inner walls of the source and drain regions and (ii) releasing the nanowire material. The inner walls of the source and drain regions are processed, to transform at least the part of the inner wall of the source region to a first spacer and to transform at least the part of the inner wall of the drain region to a second spacer.

Methodologies and structures of the present disclosure can provide an improved nanowire (or nanoribbon or nanosheet, as the case may be) interface prior to deposition of a gate dielectric and metal gate, according to some embodiments. Accordingly, such methodologies can improve transistor mobility and reliability, in some such cases. Numerous variations, embodiments, and applications will be apparent in light of the present disclosure.

General Overview

Field effect transistors (FETs) have been scaled to smaller and smaller sizes to achieve faster circuit operation. Such scaling has resulted in the development of gate-all-around (GAA) transistors, examples of which include nanowire or nanoribbon transistors, and forksheet transistors. For example, the GAA channel region can have one or more nanowires extending between the source and drain regions, such as a vertical stack of nanowires that extend horizontally between the source and drain regions. Generally, in GAA transistors (such as nanowire transistors, forksheet transistors), source and drain regions are epitaxially grown after formation of gate spacers, and the source and drain regions are adjacent to the gate spacers. In an example, the gate spacers usually comprise silicon nitride. In an example, in such GAA transistors, due to the presence of the at least partially amorphous nitride gate spacers, the epitaxially grown source and drain regions may not fully nucleate, resulting in possible dislocations and defects in the source and drain regions, which in turn results in low strain in the nanowires. Loss of strain in nanowires affects a PMOS device more than an NMOS device, as loss in strain in nanowires adversely affects movement of holes more than movement of electrons. Additionally, such nitride gate spacers have a relative high dielectric constant, e.g., in the range of about 4.8 to 7. Thus, the gate spacers having relative high dielectric constant between the gate electrode and the source/drain region results in substantial parasitic capacitance, which results in degraded CV/I (i.e., capacitance*voltage/current) gate delay performance metric for the GAA transistor architecture. Gate spacers between the gate electrode and the source/drain region is a dominant source of dead space capacitance, which limits the switching performance in GAA devices. Replacing the gate spacer dielectric with a lower-k material (such as silicon dioxide, or ultra-low-k silicon carbide) penalizes the fidelity of the gate spacer and makes it susceptible to etches and cleans frequently used in CMOS fabrication, leading to degraded yield. Furthermore, loss of strain in the nanowires are still prevalent, regardless of k-value of inner spacer, which is an issue for PMOS performance.

Thus, and in accordance with various embodiments of the present disclosure, techniques are disclosed for forming transistor devices having strained channel regions, and having relatively low-k (e.g., with dielectric constant between 3.9 to 4.2) gate spacers between source/drain regions and gate electrode. The techniques can be used with any number of transistor technologies, and are particularly useful for PMOS GAA transistors. The strained nanowires improve hole mobility in the nanowires, resulting in better performance of the PMOS transistor. The low-k gate spacers improve dead space parasitic capacitance between the gate electrode and the source/drain region, thereby resulting in better switching performance, especially for high frequency operation.

In some embodiments, the gate spacers are formed by processing inner walls of the source and drain regions. For example, the source and drain regions are formed prior to formation of the gate spacers. Because the source and drain regions are epitaxially formed without any adjacent gate spacers, the epitaxial source and drain regions can adequately nucleate and grow relatively defect free, with lattice structure matched with that of the nanowires (or other semiconductor body of the channel region). This introduces strain in the nanowires. Subsequently, the dummy gate material(s) are removed to expose the channel region and the nanowires are released, thereby exposing sections of inner walls of the source and drain regions, where the inner wall of the source region faces the nanowires and the inner wall of the drain region faces the nanowires. The exposed inner walls of the source and drain regions are then processed, to transform the exposed inner walls of the source and drain regions to gate spacers, as further explained herein.

In one embodiment, for example, the exposed inner walls of the source and drain regions are oxidized, to form the gate spacers. For example, a PMOS transistor may have silicon germanium (SiGe) source/drain regions, and the SiGe inner walls are oxidized to form silicon germanium oxide (SiGeO) gate spacers. Thus, in one such embodiment, the PMOS transistor comprises doped source/drain regions including SiGe, gate spacers including SiGeO, and strained nanowires comprising silicon. The oxidation is performed at an appropriate temperature and for an appropriate duration (e.g., in the range of 450 to 500° C., for 5 to 60 minutes) at which the SiGe inner walls of the source/drain regions oxidize, but the silicon nanowires do not oxidize. The thickness of the oxidation can be increased by increasing the duration of the oxidation process, as will be appreciated. In some embodiments, the thickness of the SiGeO is in the range of 5 to 50 angstroms.

In another embodiment, the exposed inner walls of the source and drain regions undergo condensation annealing, to form the gate spacers. For example, again assume the nanowire transistor has SiGe source/drain regions. During the condensation process, some germanium from the inner walls migrate to tip regions of the nanowires (or nanoribbons or nanosheets, as the case may be). Subsequently, the remaining germanium and the silicon of the inner walls are oxidized to form SiO2 and SiGeO gate spacers. The condensation is performed at an appropriate temperature (e.g., in the range of 800 to 950° C.) and for a relatively short period of time (e.g., between 1-20 milliseconds, or less than 10 milliseconds, or less than 5 milliseconds such as between 1 to 3 milliseconds), which allows condensation and oxidation of the inner walls of the source/drain regions, but not the silicon nanowires. Thus, in such an embodiment, the PMOS transistor comprises doped source/drain regions including SiGe, gate spacers including SiO2 and SiGeO, and strained nanowires comprising silicon and SiGe. Note that the SiGe in the nanowires include germanium that migrated from the inner walls to the nanowires. The SiGe in the nanowires is mostly confined in the tip regions of the nanowires, and not in the middle region of the nanowires.

The resulting gate spacers, formed either by oxidizing and/or condensation of the inner walls of the source/drain regions, have low-k material (e.g., with dielectric constant less than 4.5). The low-k gate spacers, as discussed above, may improve dead space parasitic capacitance between the gate electrode and the source/drain region, thereby resulting in better switching performance. Furthermore, as discussed, because the source and drain regions are epitaxially formed without any adjacent gate spacers, the epitaxial source and drain regions can adequately nucleate and grow relatively defect free, with lattice structure matched with that of the nanowires (or other channel semiconductor body, or bodies, as the case may be), thereby introducing strain in the nanowires and leading to better performance of the transistor.

As used herein, the term "nanowire" is not limited to structures of a particular cross-sectional shape, but includes structures of a rectangular, square, trapezoidal, "racetrack" (e.g., parallel sides connected by rounded ends), circular, oval, elongated, and other cross-sectional shapes, some of which may be referred to as nanoribbons or beaded-fins. A nanowire can be made of semiconducting material, or more generally, any suitable channel material. As will be further appreciated in light of this disclosure, reference to nanowires is also intended to include other gate-all-around channel regions, such as nanoribbons, nanosheets, forksheets, and other such semiconductor bodies around which a gate structure can wrap. To this end, the use of a specific channel region configuration (e.g., nanowire) is not intended to limit the present description to that specific channel configuration.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer.

In some embodiments, a plurality of channel layers of compositionally different channel materials or geometries may be formed on different areas of the substrate, such as for CMOS applications, for example. For instance, a first channel material layer may be formed on a first area of a silicon base to be used for one or more p-channel transistor devices (e.g., one or more PMOS devices) and a second channel material layer may be formed on a second area of the silicon base to be used for one or more n-channel transistor devices (e.g., one or more NMOS devices). As previously described, by selecting the substrate to have the desired material characteristics (e.g., the desired semiconductor material, the desired dopant concentration, and desired dopant type) the substrate can be used to grow multiple different channel layers.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate a transistor with gate spacers comprising silicon, germanium and oxygen. Such tools may also be used to detect SiGe in tip regions of nanowires. Furthermore, such tools may also be used to detect strain in the nanowires (or nanoribbons, or nanosheets, as the case may be).

Numerous configurations and variations will be apparent in light of this disclosure.

Architecture and Methodology

Figure 1B:
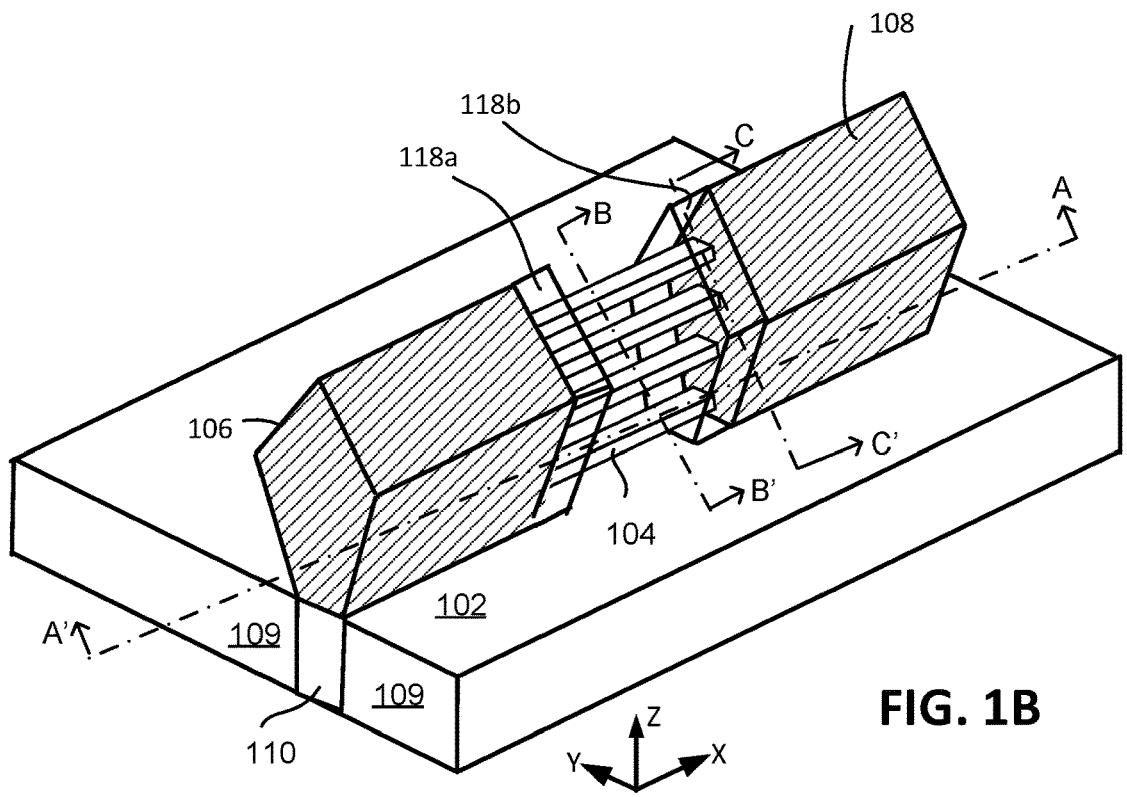
FIG. 1B illustrates a side-perspective view of the nanowire semiconductor device, where the nanowire semiconductor device has gate spacers formed by oxidation of inner walls of source region and drain region, in accordance with an embodiment of the present disclosure.

FIG. 1A illustrates a cross-sectional view of an example nanowire semiconductor device 100 (also referred to herein as "device 100") formed on a substrate 102, and FIG. 1B illustrates a side-perspective view of the nanowire semiconductor device 100, where the device 100 has gate spacers 118a, 118b formed by oxidation of inner walls of source region 106 and drain region 108, respectively, in accordance with an embodiment of the present disclosure. The cross-sectional view of FIG. 1A is along line A-A' of FIG. 1B. In an example, the device 100 is a p-type MOS (PMOS) transistor, such as a PMOS nanowire transistor. Although some embodiments of this disclosure have been discussed with respect to a nanowire transistor, the teachings of this disclosure can also be employed in other types of GAA or non-planar transistors as well, such as forksheet transistors, as will be appreciated in light of this disclosure.

As can be seen, the device 100 is formed on a substrate 102. Any number of semiconductor devices can be formed on the substrate 102, although only the single device 100 is illustrated as an example (se FIG. 7 for two devices formed on a substrate). Substrate 102 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, the substrate 102 can be a semiconductor-on-insulator substrate having a desired semiconductor layer over a buried insulator layer (e.g., silicon over silicon dioxide). Alternatively, the substrate 102 can be a multilayer substrate or superlattice suitable for forming nanowires or nanoribbons (e.g., alternating layers of silicon and SiGe, or alternating layers indium gallium arsenide and indium phosphide). Any number of substrates can be used.

The semiconductor material in the device 100 may be formed from the substrate 102. For example, the device 100 may include semiconductor material, such as nanoribbons or nanowires 104 that can be, for example, native to the substrate 102 (formed from the substrate itself). Alternatively, the semiconductor material can be formed of material deposited onto an underlying substrate. In one such example case, a blanket layer of silicon germanium (SiGe) can be deposited onto a silicon substrate, and then patterned and etched to form a plurality of SiGe fins or nanoribbons. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out.

The device 100 includes a subfin region 110 (labelled in FIGS. 1B and 1C), above which the nanowires 104 are vertically stacked. According to some embodiments, subfin region 110 comprises the same semiconductor material as substrate 102 and is adjacent to dielectric fill 109. As can be seen in FIG. 1B, the device 100 may be separated from any adjacent device (not illustrated) by a dielectric fill 109 that may include silicon oxide. Dielectric fill 109 provides shallow trench isolation (STI) between any adjacent semiconductor devices. Dielectric fill 109 can be any suitable dielectric material, such as silicon dioxide, aluminum oxide, or silicon oxycarbonitride.

The device 100 includes a nanowire channel region extending between and connecting source region 106 and drain region 108, where the channel region includes one or more nanowires 104 that extend horizontally and are arranged in a vertical stack. According to some embodiments, the source region 106 and the drain region 108 are epitaxial regions that are formed prior to formation of gate spacers 118a, 118b, as will be discussed herein in turn. In an example, the device 100 is a PMOS transistor, and the source region 106 and the drain region 108 comprises appropriately doped SiGe. The source and drain regions 106, 108 may include multiple layers such as liners and capping layers to improve contact resistance.

Although four nanowires 104 are illustrated in FIGS. 1A and 1B, the channel region can have any different number of nanowires, such as one, two, three, five, or higher. Although in FIGS. 1A-1B the nanowires 104 extend horizontally and are stacked vertically, the present disclosure contemplates nanowires in a variety of configurations that include planar nanowire transistors, nanowires that extend vertically and are stacked horizontally, and other arrangements, as will be appreciated.

In the example structure of FIGS. 1A-1B, each nanowire 104 includes a nanowire middle region 104a extending between nanowire tip regions 104b. For example, FIG. 1A1 illustrates a structure of a single nanowire 104 of the device 100 of FIGS. 1A and 1B, where the single nanowire 104 has a nanowire middle region 104a extending between nanowire tip regions 104b, in accordance with an embodiment of the present disclosure. The nanowire tip regions 104b contact the material of the source/drain regions 106 and 108. In an example, the device 100 may be a p-channel device having semiconductor nanowires 104 doped with n-type dopants (e.g., phosphorous or arsenic). In an example, the nanowires 104 comprise silicon. In an example, both the nanowire middle region 104a and the nanowire tip regions 104b are compositionally similar and comprises silicon (note that an alternate embodiment discussed with respect to FIG. 2A has compositionally different nanowire middle region and nanowire tip regions).

A gate structure contacts and at least in part surrounds each nanowire 104 between the source and drain regions 106, 108, where the gate structure includes gate dielectric 112, a gate electrode 116, and gate spacers 118a, 118b. Note that the gate dielectric 112 and the gate electrode 116 are not illustrated in FIG. 1B, in order to show the geometry of the nanowires 104. Furthermore, the gate spacers 118a, 118b are illustrated to be transparent in FIG. 1B, in order to show the geometry of the nanowires 104 protruding through the gate spacers 118a, 118b.

In the device 100, the gate dielectric 112 wraps around each nanowire 104. For example, the gate dielectric 112 wraps around the middle region 104a of individual nanowire 104, as illustrated in FIGS. 1A and 1A1. The gate dielectric 112 may include a single material layer or multiple stacked material layers. In some embodiments, gate dielectric 112 includes a first dielectric layer such as silicon oxide, and a second dielectric layer that includes a high-K material such as hafnium oxide. The hafnium oxide may be doped with an element to affect the threshold voltage of the given semiconductor device. According to some embodiments, the doping element used in gate dielectric 112 is lanthanum. Although not illustrated, gate dielectric 112 is present around each nanoribbon 104 and may also be present over subfin portion 110 (see FIGS. 1B and 1C for the subfin portion 110). In some embodiments and although not illustrated, gate dielectric 112 is also present over a top surface of dielectric fill 109.

According to some embodiments, a gate electrode 116 extends over and wraps around the nanowires 104. Gate electrode 116 may include any sufficiently conductive material such as a metal, metal alloy, or doped polysilicon. In some embodiments and although not illustrated, one or more work function metals may be included around the nanoribbons 104. In an example, Interlayer dielectric (ILD) material 115 are adjacent to the gate electrode 116.

The gate structure also includes the gate spacers 118a, 118b that extend along the sides of the gate electrode 116, to isolate the gate electrode 116 from the source and drain regions 106, 108. For example, a first gate spacer 118a isolates the gate electrode 116 from the source region 106, and a second gate spacer 118b isolates the gate electrode 116 from the drain region 108. The gate spacers 118a, 118b surround the tip regions 104b of individual nanowires. For example, the first gate spacer 118a surround first tip region of individual nanowires that are in contact with the source region 106, and the second gate spacer 118a surround second tip regions of individual nanowires that are in contact with the drain region 108.

As will be discussed herein in turn in further detail, the gate spacer 118a is formed by oxidation of an inner wall of the source region 106, and the gate spacer 118b is formed by oxidation of an inner wall of the drain region 108. For example, as will be discussed in further detail in turn, during manufacturing of the device 100, an inner wall of the source region 106 (e.g., which faces the nanowires 104 and the drain region 108) is oxidized to form the gate spacer 118a, where the oxidation is performed in those sections of the inner wall that are not connected to the nanowires 104, e.g., as discussed with respect to FIGS. 3F and 3F herein later. Similarly, during manufacturing of the device 100, an inner wall of the drain region 108 (e.g., which faces the nanowires 104 and the source region 106) is oxidized to form the gate spacer 118b, where the oxidation is performed in those sections of the inner wall that are not connected to the nanowires 104, e.g., as also discussed with respect to FIGS. 3E and 3F herein later.

As the gate spacer 118a is formed by oxidation of the inner wall of the source region 106, the gate spacer 118a and the inner wall of the source region 106 has similar cross-sectional shape. Similarly, as the gate spacer 118b is formed by oxidation of the inner wall of the drain region 108, the gate spacer 118b and the inner wall of the drain region 108 has similar cross-sectional shape. For example, as illustrated in FIG. 1B, the inner wall of the source region 106 has a shape of a pentagon, and a corresponding wall of the first gate spacer 118a (e.g., which faces the source region 106) also has a similar pentagon shape. Similarly, for example, the inner wall of the drain region 108 has a shape of a pentagon, and a corresponding wall of the second gate spacer 118b (e.g., which faces the drain region 108) also has a similar pentagon shape. Note that the faceted pentagon shape of the inner walls of the source and drain regions 106, 108 is merely an example, and the teachings of this disclosure is not limited to any specific shape of the source and drain regions 106, 108 and corresponding shapes of the gate spacers 118a, 118b.

As discussed, in an embodiment, the device 100 is a PMOS transistor, and the source and drain regions 106, 108 comprise doped SiGe. As the gate spacers 118a, 118b are formed by oxidation of corresponding inner walls of the source and drain regions 106, 108, respectively, the gate spacers 118a, 118b comprise SiGeOx. In an example, a concentration of Ge in the source and drain regions 106, 108 may be substantially same as a concentration of Ge in the gate spacers 118a, 118b. This is because the gate spacers 118a, 118b are initially part of the source and drain regions 106, 108, respectively, where the corresponding part of the source and drain regions 106, 108 are oxidized to form the gate spacers 118a, 118b.

As discussed, the gate spacers 118a, 118b comprising SiGeO are formed by oxidation of corresponding inner walls of the source and drain regions 106, 108, respectively. Selective oxidation of the inner walls of the source and drain regions 106, 108 results in the gate spacers 118a, 118b having a relatively low-k spacer material for the gate spacers 118a, 118b. For example, the SiGeO gate spacers 118a, 118b have a dielectric constant in the range of about 3.9 to 4.5. In contrast, consider the case where gate spacers of nanowire transistors comprise silicon nitride ($Si_3N_4$), with a relative high dielectric constant in the range of about 4.8 to 7. Because the gate spacers 118a, 118b have relatively low dielectric constant (e.g., compared to gate spacers comprising silicon nitride), parasitic capacitance of the gate spacers 118a, 118b of the device 100 is relatively low (e.g., compared to transistors including silicon nitride gate spacers), which increases switching performance of the device 100 especially at high frequency of operation.

Figure 3A:
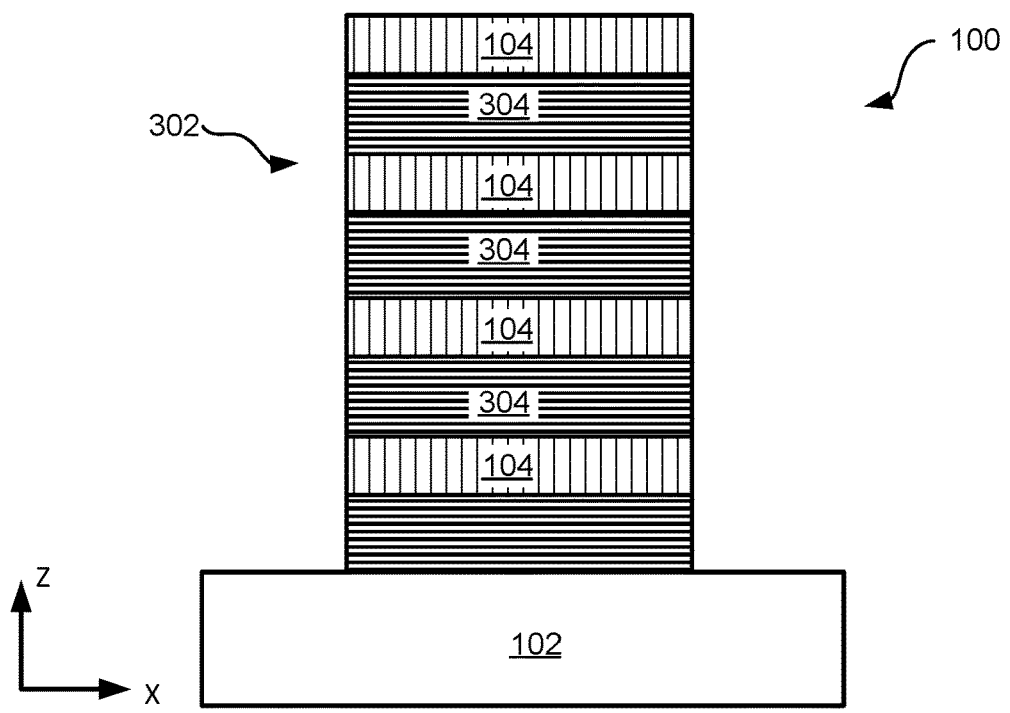
FIGS. 3A-3H illustrate cross-sectional views of an example nanowire semiconductor device in various stages of processing, where the nanowire semiconductor device has gate spacers formed by oxidation of inner walls of source region and drain region, in accordance with an embodiment of the present disclosure.
Figure 3B:
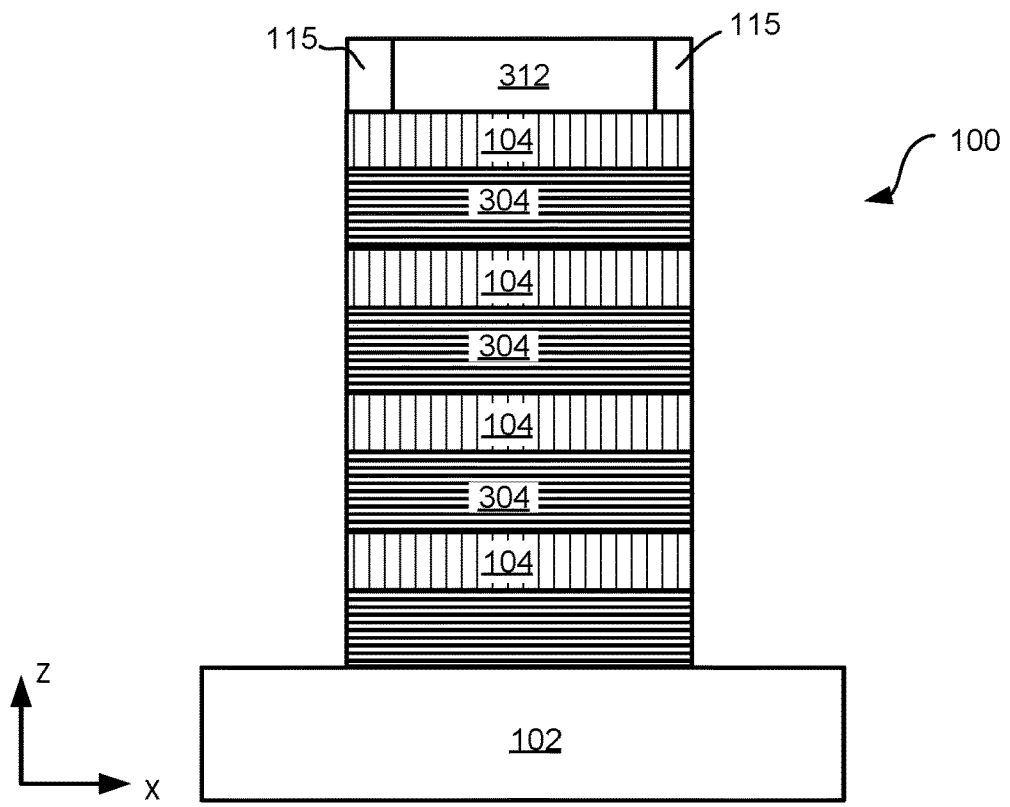
Figure 3C:
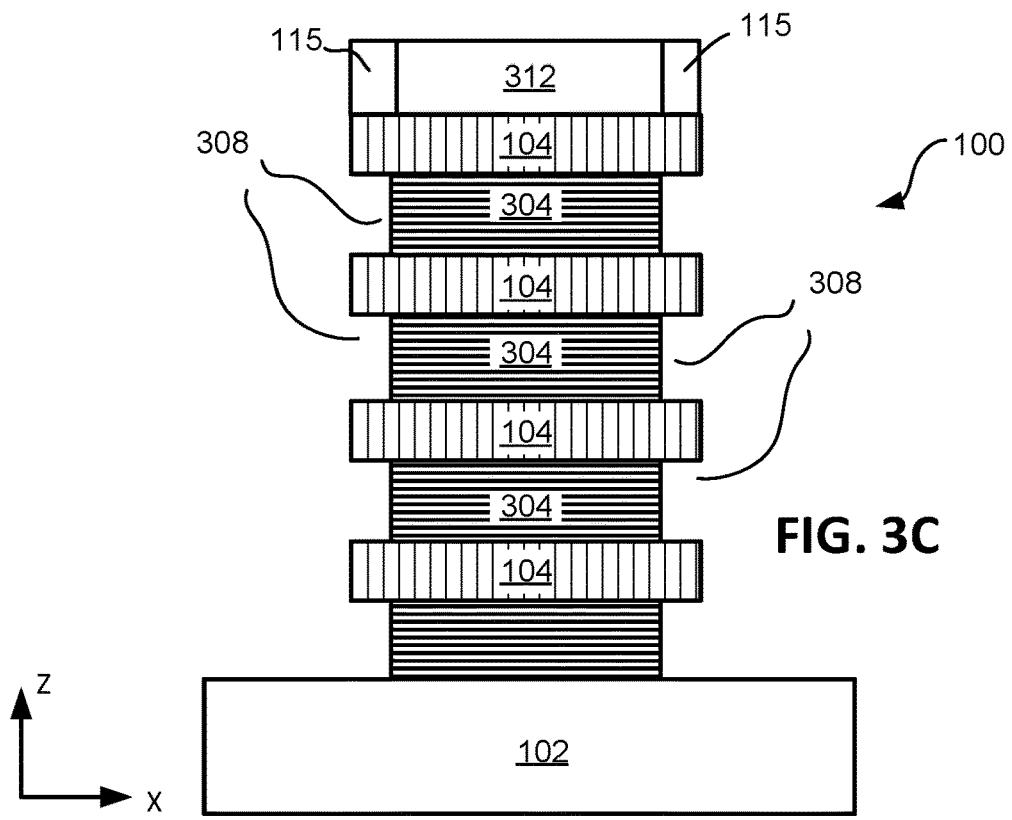
Figure 3D:
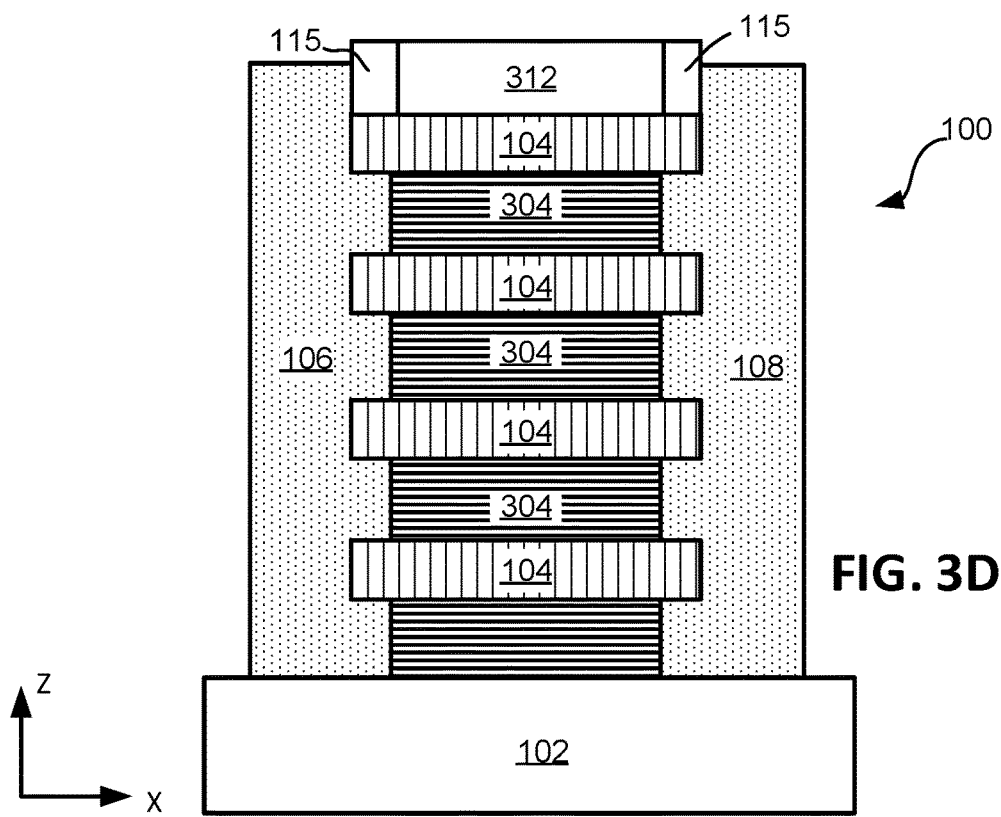

Additionally, as will be discussed in further detail herein later with respect to FIGS. 3C and 3D, the epitaxial growth of the source region 106 and the drain region 108 is performed prior to the formation of the gate spacers 118a, 118b. In contrast, consider the case where the source and drain regions are epitaxially grown after formation of gate spacers, and the source and drain regions are adjacent to gate spacers, and that the gate spacers are silicon nitride. In such cases, due to the presence of the at least partially amorphous nitride gate spacers, the epitaxially grown source and drain regions may not fully nucleate, resulting in possible dislocations and defects in the source and drain regions, which in turn results in low strain in the nanowires. However, in the device 100 of FIGS. 1A-1B, the epitaxial growth of the source region 106 and the drain region 108 is performed prior to the formation of the gate spacers 118a, 118b, and hence, the source and drain regions 106, 108 are grown adjacent to semiconductor material comprising sacrificial SiGe and Si of the nanowires (e.g., see FIGS. 3C and 3D herein later). Hence, the epitaxial source and drain regions 106, 108 can be nucleated and grow relatively defect free, with lattice structure matched with that of the Si nanowires. This introduces adequate strain in the nanowires 104 of the PMOS device 100. The strained nanowires 104 of the device 100 increases hole mobility within the nanowires 104, which in turn improves the performance of the PMOS device 100.

Note that FIGS. 1A and 1B do not illustrate all components of the device 100, for purposes of illustrative clarity. FIG. 1E illustrates the device 100 of FIG. 1A including source/drain contacts 320. For example, in the illustration of FIG. 1E, an ILD layer 318 is above the source and drain regions 106, 108 and the gate stack. A source contact 320 extends within the ILD layer 318 and contacts the source region 106, a drain contact 320 extends within the ILD layer 318 and contacts the drain region 108, and a gate contact 324 extends within the ILD layer 318 and contacts the gate electrode 116.

Figure 1C:
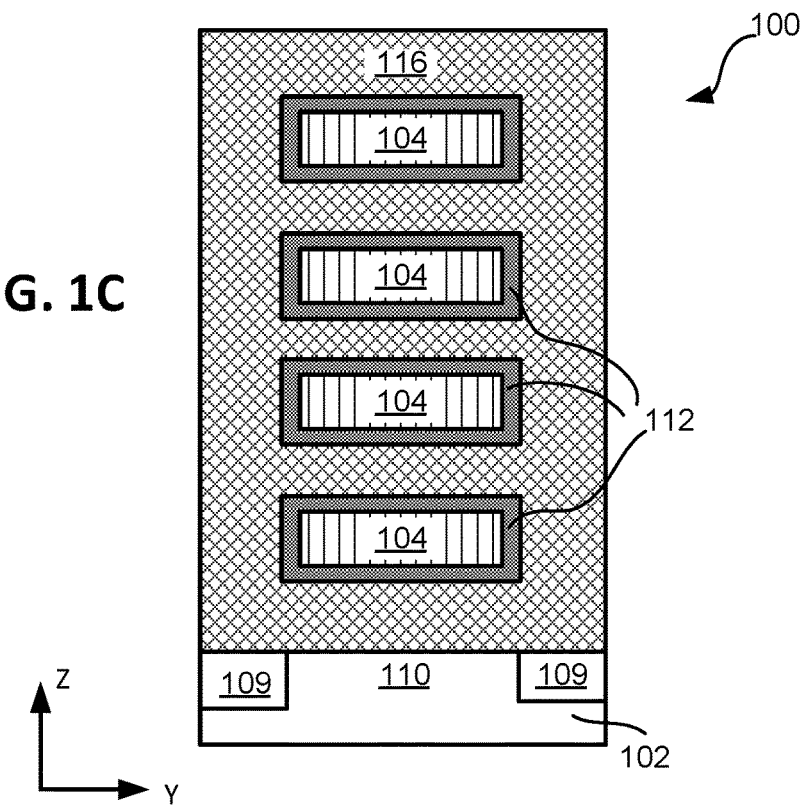
FIGS. 1C and 1D illustrate corresponding cross-sectional views of the nanowire semiconductor device of FIGS. 1A and 1B, in accordance with an embodiment of the present disclosure.
Figure 1D:
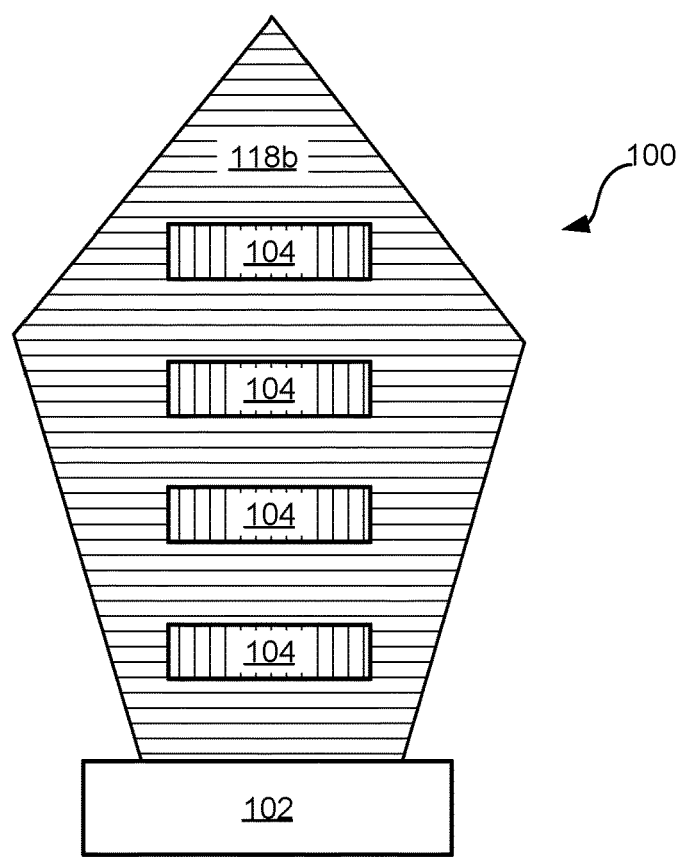
Figure 1E:
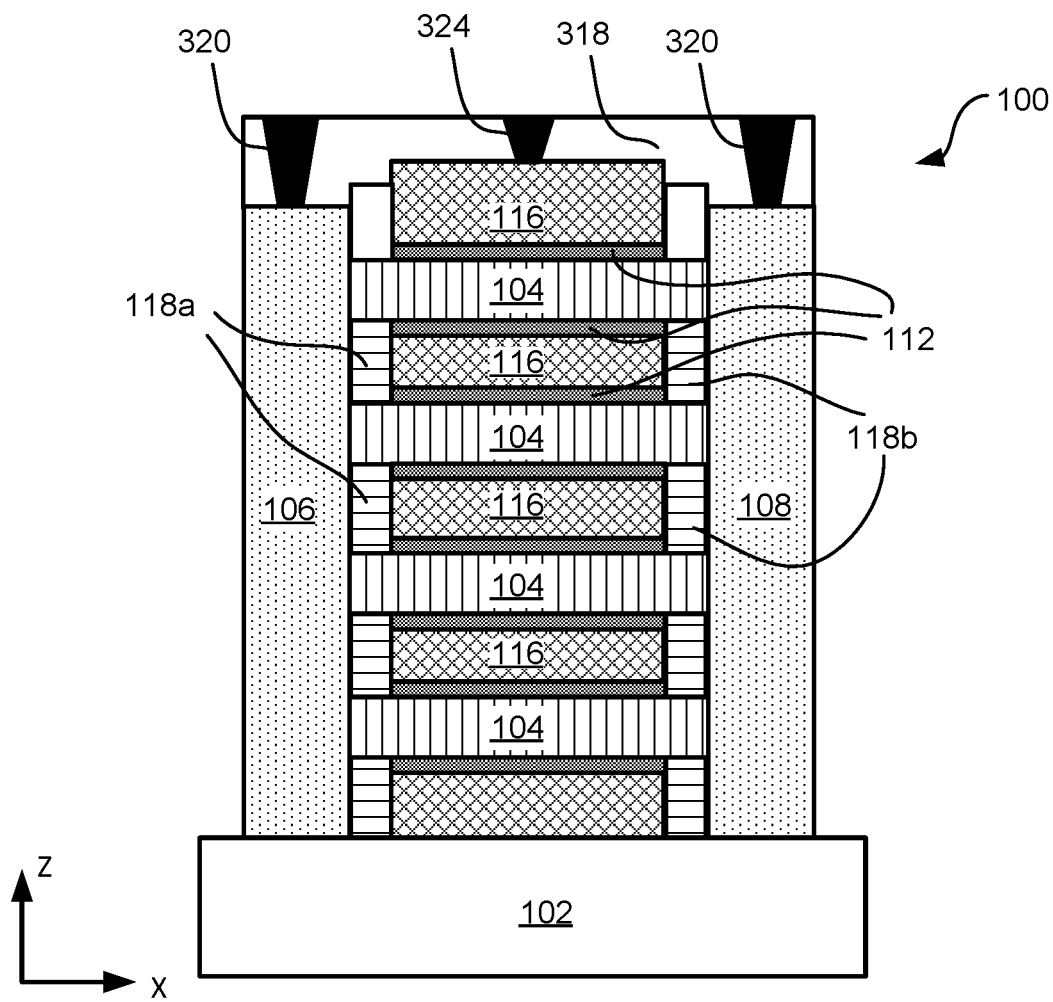
FIG. 1E illustrates the nanowire semiconductor device of FIG. 1A including source/drain contacts, in accordance with an embodiment of the present disclosure.

FIGS. 1C and 1D illustrate corresponding cross-sectional views of the nanowire transistor structure 100 of FIGS. 1A and 1B, in accordance with an embodiment of the present disclosure. The cross-sectional view of FIG. 1C is along line B-B' of FIG. 1B, and the cross-sectional view of FIG. 1C is along line C-C' of FIG. 1B. For example, the cross-sectional view of FIG. 1C illustrates the middle regions of the nanowires 104 surrounded by the gate dielectric 112, and the gate electrode 116 in contact with and wrapping around the gate dielectric 112. The cross-sectional view of FIG. 1D illustrates the tip regions of the nanowires 104 protruding through the gate spacer 118b. Note that the tip regions of the nanowires 104 (which are protruding through the gate spacer 118b) are not surrounded by the gate dielectric 112, as illustrated in FIGS. 1A, 1A1, 1B, and 1D.

Figure 2B:
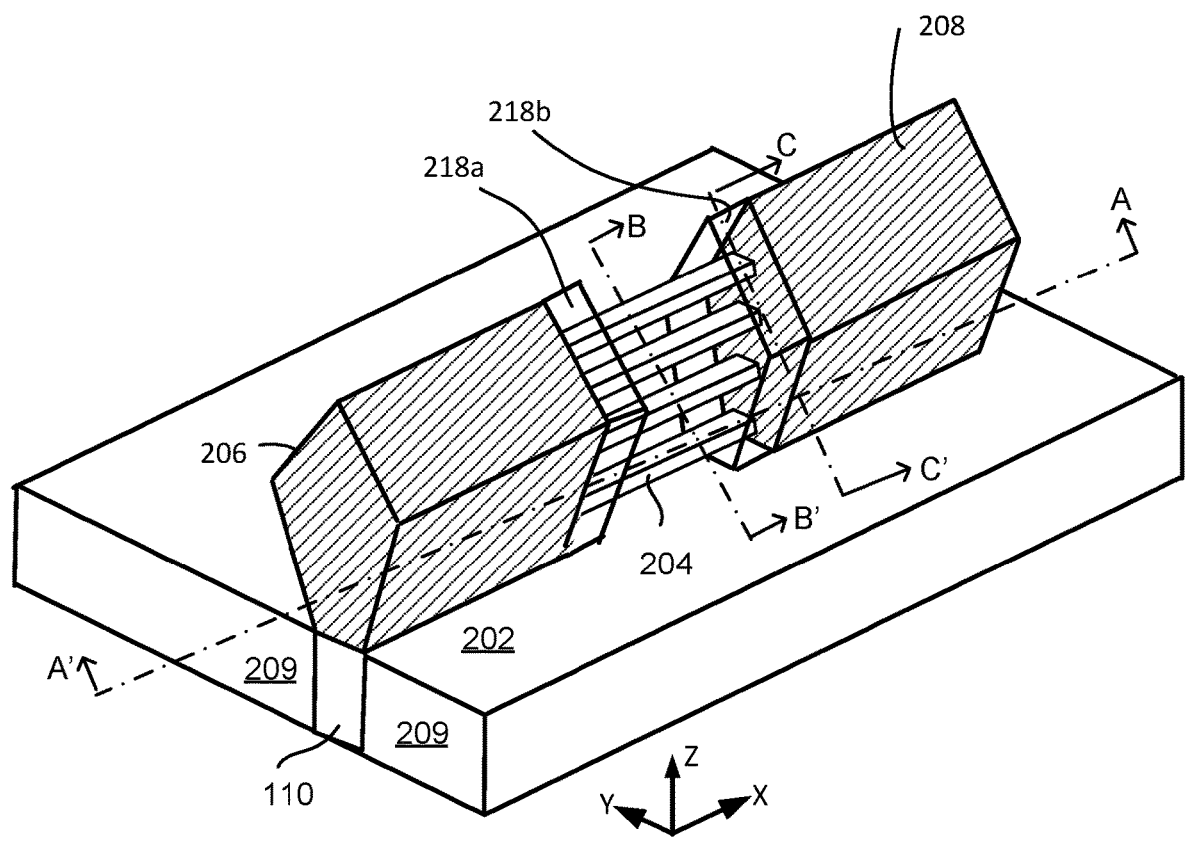
FIG. 2B illustrates a side-perspective view of the nanowire semiconductor device of FIG. 2A, where the nanowire semiconductor device has gate spacers formed by condensation annealing of inner walls of source region and drain region, in accordance with an embodiment of the present disclosure.

FIG. 2A illustrates a cross-sectional view of another example nanowire semiconductor device 200 (also referred to herein as "device 200") formed on a substrate 202, and FIG. 2B illustrates a side-perspective view of the nanowire semiconductor device 200, where the device 200 has gate spacers 218a, 218b formed by condensation annealing of inner walls of source region 206 and drain region 208, respectively, in accordance with an embodiment of the present disclosure. The cross-sectional view of FIG. 2A is along line A-A' of FIG. 2B. In an example, the device 200 is a p-type MOS (PMOS) transistor, such as a PMOS nanowire transistor.

Comparing the device 100 of FIGS. 1A-1D and the device 200 of FIGS. 2A-2B, the two devices have many similar components, and such components are labelled using similar labels. At least some such similar components of the device 200 are not discussed in further detail. For example, the device 200 comprises a substrate 202, source region 206, drain region 208, ILD 215, e.g., similar to the substrate 102, source region 106, drain region 108, and ILD 115, respectively, of the device 100. Furthermore, the device 200 comprises gate structure comprising gate dielectric 212 and gate electrode 216, similar to the gate dielectric 112 and gate electrode 116, respectively, discussed with respect to the device 100.

Similar to the nanowires 104 of the device 100, the device 200 of FIGS. 2A-2B comprises nanowires 204 that extend horizontally between the source region 206 and drain region 208, and that are arranged in a vertical stack. Similar to the device 100, the source region 106 and the drain region 108 of the device 200 are, for example, epitaxial regions that are formed prior to formation of the gate spacers 218a, 218b, as will be discussed herein in turn. In an example, the device 200 is a PMOS transistor, and the source region 206 and the drain region 208 comprise appropriately doped SiGe.

As will be discussed herein in turn in further detail, the gate spacer 218a is formed by condensation and anneal process performed on an inner wall of the source region 206 (e.g., where the inner wall of the source region 206 faces the nanowires 204 and the drain region 208). Similarly, the gate spacer 218b is formed by condensation and anneal process performed on an inner wall of the drain region 208 (e.g., where the inner wall of the drain region 208 faces the nanowires 204 and the source region 206).

As the gate spacer 218a is formed from the inner wall of the source region 206, a wall of the gate spacer 218a adjacent to the source region and the inner wall of the source region 206 has similar cross-sectional shape. Similarly, a wall of the gate spacer 218b facing the drain region and the inner wall of the drain region 208 has similar cross-sectional shape. For example, the inner wall of the source region 206 has a shape of a pentagon, and the corresponding adjacent wall of the first gate spacer 218a also has a similar pentagon shape. Similarly, for example, the inner wall of the drain region 208 has a shape of a pentagon, and the corresponding adjacent wall of the second gate spacer 218b also has a similar pentagon shape. Note that the faceted pentagon shape of the inner walls of the source and drain regions 206, 208 is merely an example, and the teachings of this disclosure is not limited to any specific shape of the source and drain regions 206, 208 and corresponding shapes of the gate spacers 218a, 218b.

In the example structure of FIGS. 2A and 2B, each nanowire 204 includes a nanowire middle region 204a extending between nanowire tip regions 204b. FIG. 2A1 illustrate a structure of a single nanowire 204 having a nanowire middle region 204a extending between nanowire tip regions 204b in the device 200 of FIGS. 2A-2B. The nanowire tip regions 204b contact the material of the source/drain regions 206 and 208. In an example, the device 200 may be a p-channel device having semiconductor nanoribbons 204 doped with n-type dopants (e.g., phosphorous or arsenic).

In the device 100 of FIG. 1A-1D, both the nanowire middle region 104a and the nanowire tip regions 104b of individual nanowires 104 are compositionally similar and comprises silicon. In contrast, in the device 200 of FIGS. 2A and 2B, the nanowire middle region 204a and the nanowire tip regions 204b of individual nanowire 204 are compositionally different. For example, the nanowire middle region 204a comprises Si, and the nanowire tip regions 204b comprises Si and Ge (e.g., comprises SiGe). In an example, a concentration of Ge is graded from the tip regions 204b to the middle region 204a, with higher concentration of Ge in the tip regions 204b to a lower concentration of Ge in the middle region 204a. In a central section of the middle region 204a (e.g., that is about equidistance from the two tip regions 204b), the concentration of Ge is zero. Thus, the central section of the middle region 204a essentially comprises Si, in an example. In an example, the tip regions 204b have about 35 to 45% Ge.

In an example, sections of the tip regions 204b, which is adjacent to the gate spacer 218a or 218b, have higher Ge concentration compared to a central section of the tip region that is further from the corresponding gate spacer, as illustrated in FIG. 2A1. This is because, as discussed with respect to FIG. 5B, the Ge in the tip region 204a propagates (e.g., during a condensation and anneal stage of manufacturing) from a section of the inner wall of the source or drain region, and the section of the inner wall of the source or drain region then is transformed to the gate spacer 218, as will be discussed herein in turn in further detail with respect to FIGS. 5A-5C. Accordingly, sections of the tip region 204b adjacent to the gate spacers have the higher concentration of Ge.

As discussed, in an embodiment, the device 200 is a PMOS transistor, and the source and drain regions 206, 208 comprise doped SiGe. In an example, the gate spacers 218a, 218b comprise SiO2 and SiGeO. In an example, a concentration of Ge (e.g., 55 to 60%) in the source and drain regions 106, 108 may be higher than a concentration of Ge (e.g., 5 to 15%) in the gate spacers 218a, 218b. This is due to migration of Ge from the gate spacers 218a, 218b to the tip regions of the nanowires 204 during the above discussed condensation process, see FIG. 5B herein later.

In an example, the gate spacers 218a, 218b comprising SiO2 and SiGeO have a relatively low-k. For example, the gate spacers 218a, 218b have a dielectric constant in the range of about 3.9 to 4.2. In contrast, consider the case where gate spacers of nanowire transistors comprise silicon nitride, with a relative high dielectric constant in the range of 4.8 to 7. Because the gate spacers 218a, 218b have relatively low dielectric constant (e.g., compared to silicon nitride gate spacers), parasitic capacitance of the gate spacers 218a, 218b is relatively low (e.g., compared to transistors including silicon nitride gate spacers), which increases switching performance of the device 200 especially during high frequency operation.

Additionally, as will be discussed in further detail herein later with respect to FIG. 5A, the epitaxial growth of the source region 206 and the drain region 208 is performed prior to the formation of the gate spacers 218a, 218b. In contrast, consider a process flow where the source and drain regions are epitaxially grown after and adjacent to gate spacers, and in which the gate spacers comprise silicon nitride. In such cases, due to the presence of the at least partially amorphous nitride gate spacers, the epitaxially grown source and drain regions may not fully nucleate, resulting in possible dislocations and defects in the source and drain regions, which in turn results in low strain in the nanowires. However, in the device 200 of FIGS. 2A-2B, the epitaxial growth of the source region 206 and the drain region 208 is performed prior to the formation of the gate spacers 218a, 218b, and hence, the source and drain regions 206, 208 are grown adjacent to semiconductor material comprising sacrificial SiGe and Si of the nanowires (e.g., see FIG. 5A herein later). Hence, the source and drain regions 206, 208 can be nucleated and grow relatively defect free, with lattice structure matched with that of the Si nanowires. This introduces adequate strain in the nanowires 204 of the PMOS device 200. The strained nanowires 204 of the device 200 increases hole mobility in the nanowires 204, which in turn improves the performance of the device 200.

Figure 3E:
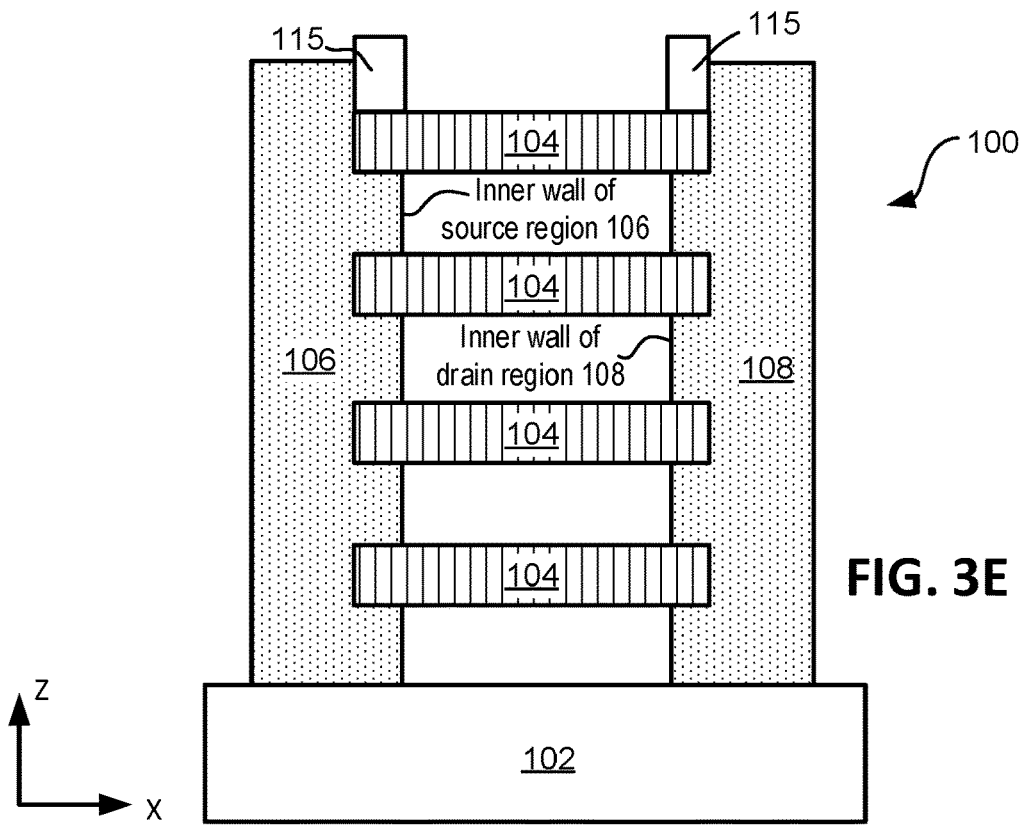
Figure 3F:
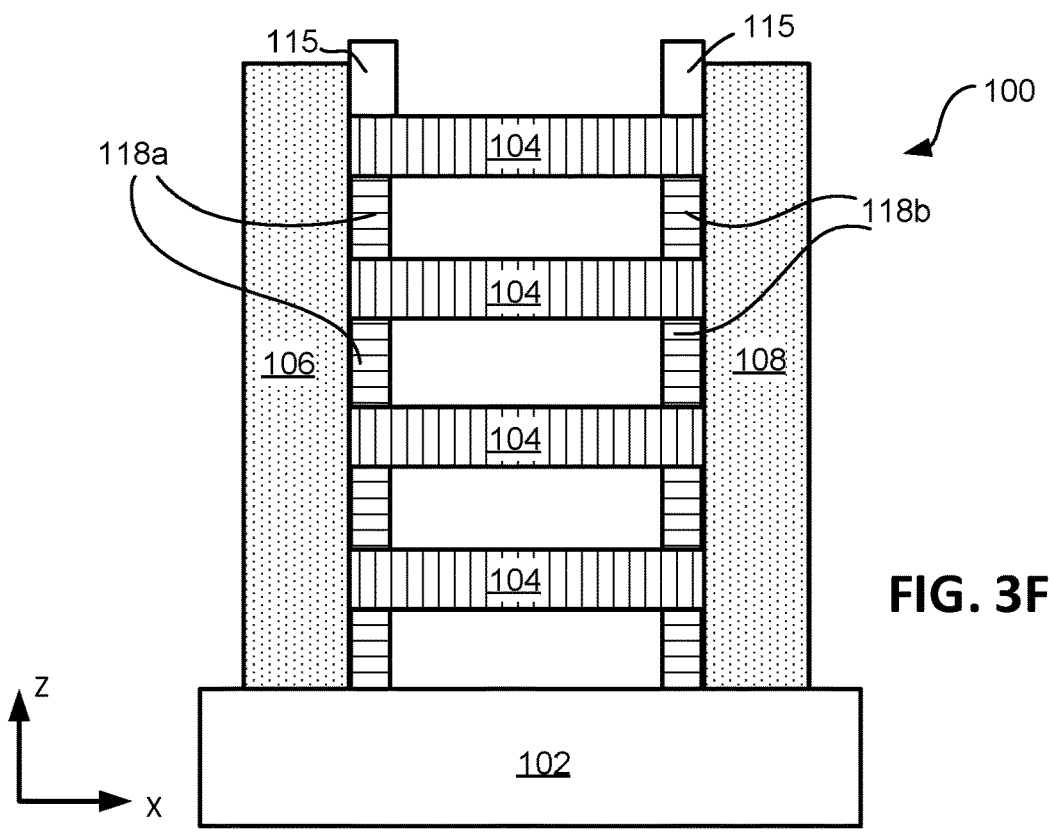
Figure 3G:
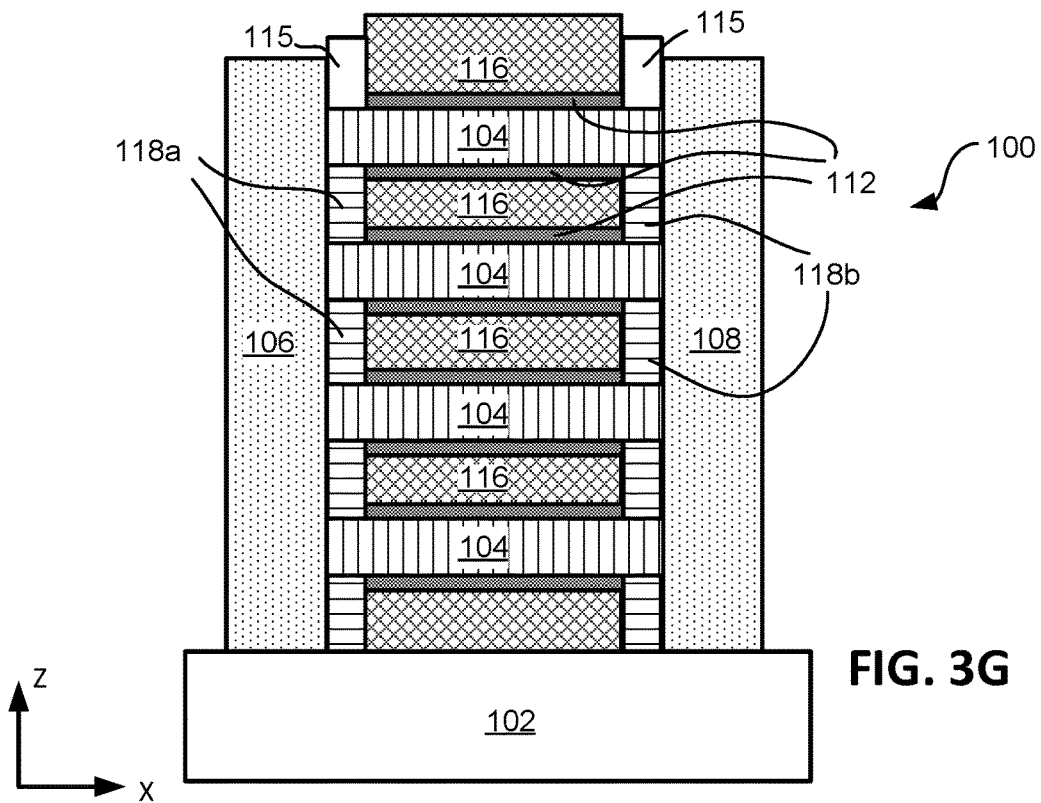
Figure 3H:
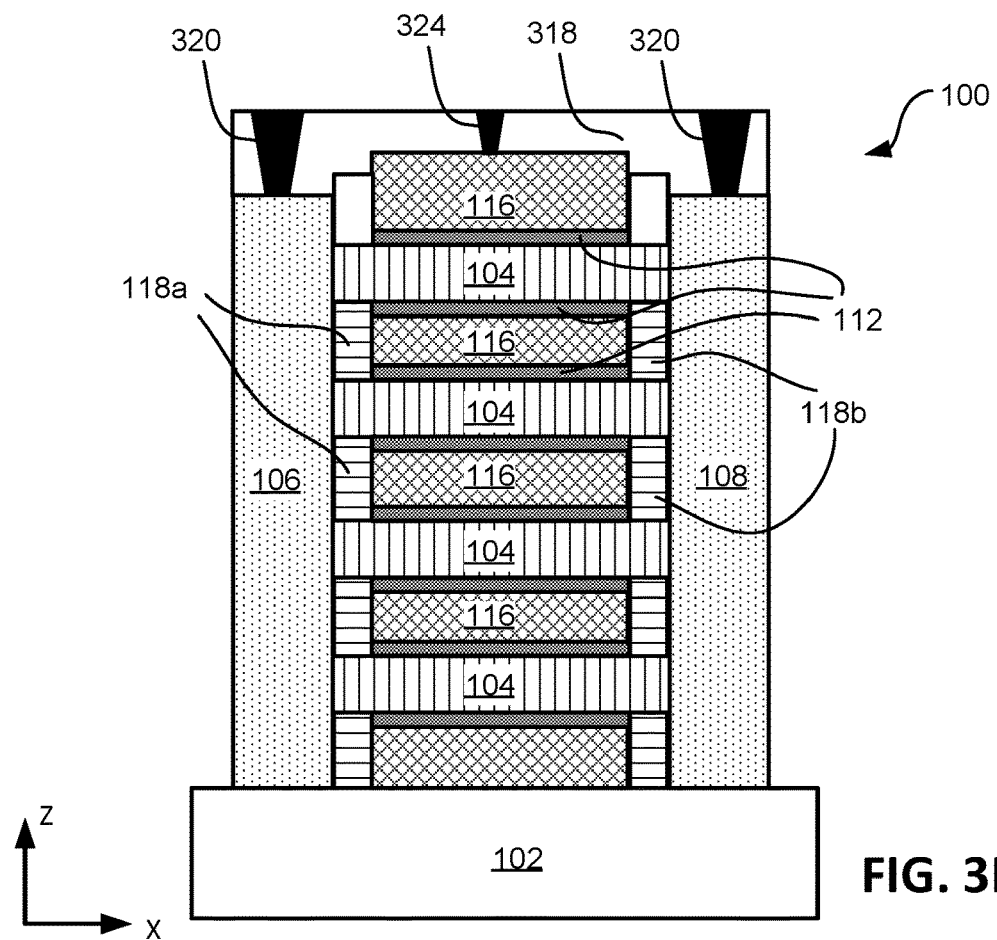
Figure 4:
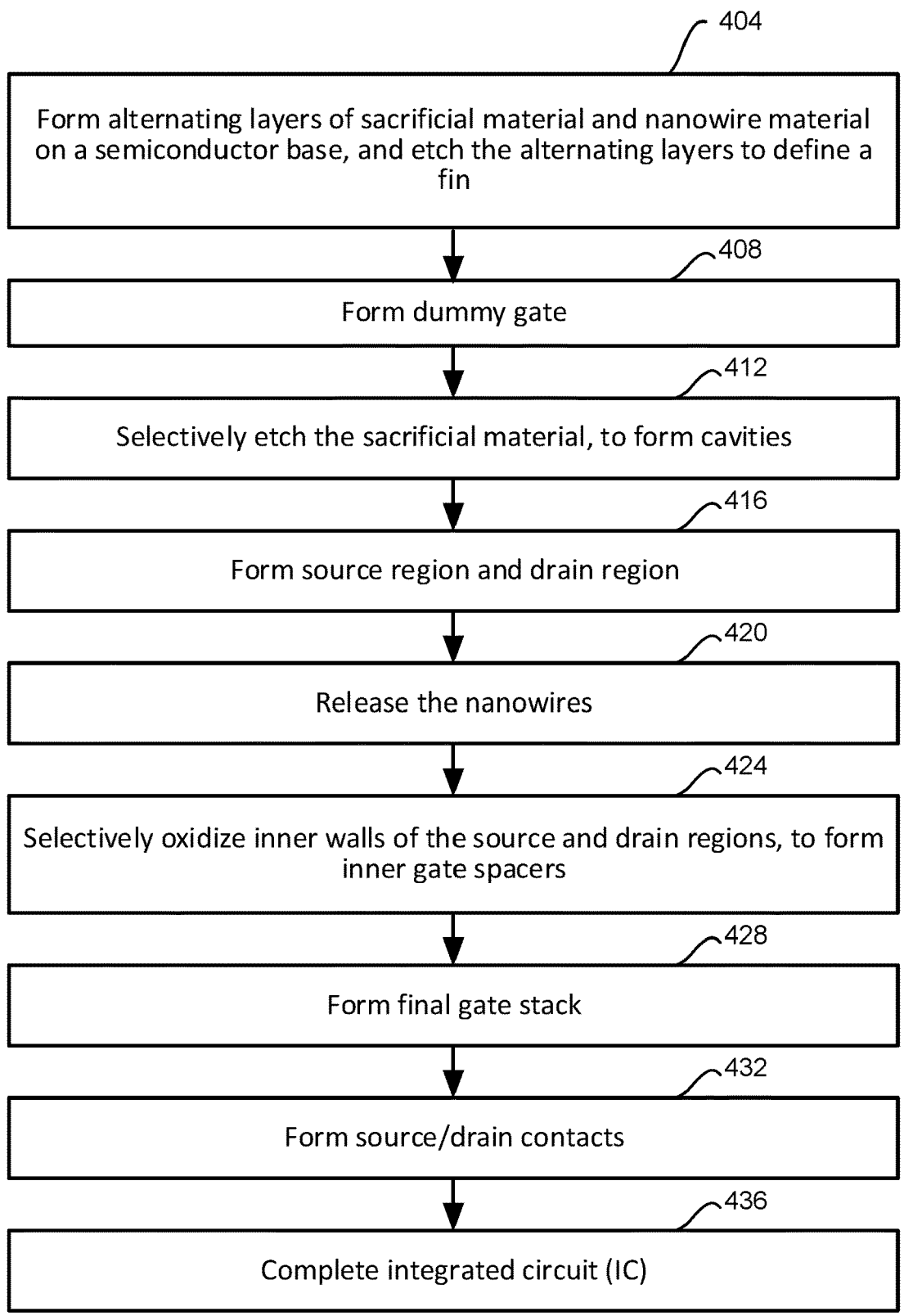
FIG. 4 illustrates a flowchart depicting a method of forming the example nanowire semiconductor device of FIGS. 3A-3H, in accordance with an embodiment of the present disclosure.

FIGS. 3A-3H illustrate cross-sectional views of an example nanowire semiconductor device (e.g., the nanowire semiconductor device 100 of FIGS. 1A and 1B) in various stages of processing, in accordance with an embodiment of the present disclosure. FIG. 4 illustrates a flowchart depicting a method 400 of forming the example nanowire semiconductor device of FIGS. 3A-3G, in accordance with an embodiment of the present disclosure. FIGS. 3A-3H and 4 will be discussed in unison. In FIGS. 3A-3H, the cross section is taken along the line AA' of FIG. 1B, i.e., similar to the cross-sectional view of FIG. 1A. For clarity of illustration, not all structures of the device 100 and not all stages of processing are shown.

Referring to FIG. 4, the method 400 includes, at 404, forming alternating layers of sacrificial material 304 and nanowire material 104 on a semiconductor base 102, and etching the alternating layers to define a fin 302. For example, FIG. 3A illustrates the device 100 including a fin 302 comprising a stack of alternating material layers on top of the substrate 102. The stack of alternating material layers includes layers of a sacrificial material 304 (e.g., SiGe) and nanowire material 104 (e.g., Si). The fin 302 of FIG. 3A can result from an anisotropic etch through blanket layers of sacrificial material 304 and channel material of the nanowires 104 to define the fin 302. Although not illustrated, in an example, the sidewalls of the fin 302 may taper slightly vertically upwards, and the top nanowire 104 can have a rounded profile due to the etch process, as will be appreciated.

In one embodiment, the semiconductor base or substrate 102 include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the base is bulk silicon, such as monocrystalline silicon. In other embodiments, the base can be any suitable semiconductor material, including silicon, silicon carbide (SiC), gallium nitride (GaN), and gallium arsenide (GaAs) to name a few examples. The base can be selected in some embodiments from III-V materials and group IV materials. Further, the base can comprise a semiconductor layer deposited or grown on a substrate, such as silicon carbide layer epitaxially grown on a sapphire substrate. In still other embodiments, the base can be bulk semiconductor material, such as a wafer sliced from a boule or other bulk semiconductor material. The base in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, the base may be doped with any suitable n-type and/or p-type dopant at a dopant concentration in the range of 1E16 to 1E22 atoms per cubic cm, for example. For instance, a silicon base can be p-type doped using a suitable acceptor (e.g., boron) or n-type doped using a suitable donor (e.g., phosphorous, arsenic) with a doping concentration of at least 1E16 atoms per cubic cm. However, in some embodiments, the base may be undoped/intrinsic or relatively minimally doped (such as including a dopant concentration of less than 1E16 atoms per cubic cm), for example. In some embodiments, the base is a silicon substrate consisting essentially of Si. In other embodiments, the base may primarily include Si but may also include other material (e.g., a dopant at a given concentration). Also, note that the base material may include relatively high quality or device-quality monocrystalline Si or other material that provides a suitable template or seeding surface from which other monocrystalline semiconductor material features and layers can be formed. Therefore, unless otherwise explicitly stated, a base as described herein is not intended to be limited to a base that only includes Si. In some embodiments, the base may have a crystalline orientation described by a Miller index of (100), (110), or (111), or its equivalents, as will be apparent in light of this disclosure. Although the base in this example embodiment is shown for ease of illustration as having a thickness (dimension in the Y-axis direction) similar to that of other layers in the figures, the base may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, the base may include a multilayer structure including two or more distinct layers that may or may not be compositionally different. In some embodiments, the base may include grading (e.g., increasing and/or decreasing) of one or more material concentrations throughout at least a portion of the material. In some embodiments, the base may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

In one embodiment, the sacrificial material layer 304 is formed directly on the base, followed by the nanowire material, and followed by additional layer pairs of sacrificial material and nanowire material. For example, the first (bottom) layer on the base is the sacrificial material. In one example embodiment, the base is bulk silicon (Si), the sacrificial material is silicon germanium (SiGe), and the nanowire material is silicon doped with a suitable dopant and concentration. Other material combinations can also be used, as will be appreciated.

Each layer of sacrificial material or nanowire material can be formed using any suitable processing, such as one or more deposition or epitaxial growth processes, as will be apparent in light of this disclosure. In one embodiment, alternating layers of sacrificial material and nanowire material can be formed using layer-by-layer epitaxial growth, where the sacrificial material can subsequently be removed to release nanowires. For instance, in an example embodiment, a given nanowire layer may include alternating layers of group IV and group III-V semiconductor material, where either the group IV or group III-V material is sacrificial, to enable the formation of one or more nanowires. In some embodiments, a given layer of nanowire material may include a vertical channel height (dimension in the Y-axis direction) in the range of 5 nm to 50 nm (or in a subrange of 5-45, 5-40, 5-35. 5-30. 5-25, 5-20, 5-15, 5-10, 10-40, 10-30, 10-20, 15-40, 15-30, 15-20, 20-40, 20-30 and 30-40 nm) and/or a maximum vertical thickness of at most 50, 40, 30, 25, 20, 15, or 10 nm, for example. Other suitable materials and channel height requirements or thresholds will be apparent in light of this disclosure. Numerous different nanowire material configurations and variations will be apparent in light of this disclosure.

As discussed, block 404 of the method 400 also includes etching the alternating layers of sacrificial material and nanowire material, to define the fin 302. For example, each fin has a subfin portion of base material and an upper fin portion of alternating layers of sacrificial material and channel material. In embodiments where blanket layers of material are formed on the base in process, for example, regions to be processed into fins are masked, followed by etching the surrounding regions to define one or more fins. For instance, the an anisotropic etch proceeds substantially vertically through the upper fin portion to define isolation trenches between adjacent fins. In some embodiments, the etch process proceeds into the base to define a fin that includes a subfin portion of the base material and an upper fin portion of alternating layers of sacrificial material and channel material. In some embodiments, the etch process defines groups of parallel fins extending vertically up from the base, and FIG. 3A illustrates one such example fin 302.

In other embodiments, for example, the alternating layers of sacrificial material and channel material are formed on the base by growth or deposition in a trench. For example, the trench is an aspect ratio trapping trench ("ART" trench) defined in a layer of insulating material, such as silicon dioxide (SiO2) formed by thermal oxidation or by deposition using a suitable one of the aforementioned techniques. The insulating material is then patterned and etched to define trenches that extend to a substrate or other material layer. A base material can be formed directly on the substrate in the lower portion of the trench, followed by alternating layers of the sacrificial material and channel material. The insulating material can be recessed to expose all or part of the fin. In some embodiments, the insulating material is recessed to the top of the subfin (i.e., base material) to expose only the layer stack of sacrificial material and channel material in the upper portion of the fin. In other embodiments, the insulating material is recessed completely to expose the entire subfin, or recessed to a level below the first layer of sacrificial material to expose a portion of the subfin. Numerous variations and embodiments will be apparent in light of the present disclosure.

In yet other embodiments, defining fins may be performed using a replacement fin-based approach. In one embodiment, the replacement fin-based approach includes forming fins in the base, such as by patterning and etching bulk semiconductor material. Shallow trench isolation (STI) material is the formed around those fins, followed by recessing the native-to-substrate fins to define fin-shaped trenches in the STI material. Subfin material and alternating layers of sacrificial material and channel material can then be formed in the fin-shaped trenches. In one embodiment, the replacement fin approach continues with removing the STI material and forming an insulating material on the base between the subfins, leaving the layer stack of alternating sacrificial material and channel material exposed.

In some embodiments, the subfin is a Group IV semiconductor material, such as single-crystal silicon or germanium. In other embodiments, the subfin material is a Group III-V semiconductor material, such as GaAs, InGaAs, AlGaAs, or AlAs, to name a few examples. In some embodiments, the subfin material may or may not be doped with a suitable dopant (e.g., boron, phosphorous, and/or arsenic). In embodiments where the subfin material is doped, it may be n-type doped (e.g., with phosphorous or arsenic) or p-type doped (e.g., with boron) at a dopant concentration in the range of 1E16 to 1E22 atoms per cubic cm, for example. In some embodiments, the subfins may have a multilayer structure including two or more distinct layers (that may or may not be compositionally different). In some embodiments, the subfins may include grading (e.g., increasing and/or decreasing) of one or more material concentrations throughout at least a portion of the subfin material.

In some embodiments, each fin may include a vertical fin height (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/ or a maximum vertical fin height of at most 500, 450, 400, 350, 300, 250, 200, 150, 100, or 50 nm, for example. In some embodiments, each fin may include a horizontal fin width (dimension in the X-axis direction) in the range of 2-50 nm (or in a subrange of 2-5, 2-10, 5-10, 5-20, 5-30, 5-50, 10-20, 10-30, 10-50, 20-30, 20-50, or 30-50 nm) and/or a maximum horizontal fin width of at most 50, 30, 20, 10, or 5 nm, for example. In some embodiments, the ratio of fin height to fin width may be greater than 1, such as greater than 1.5, 2, 2.5, 3, 3.5, 4, 4.5, 5, 6, 7, 8, 9, 10, 15, 20, or greater than any other suitable threshold ratio, as will be apparent in light of this disclosure. Other suitable materials and thickness values/ranges/thresholds will be apparent in light of this disclosure.

In some embodiments, the base or subfin material may be oppositely type doped relative to the overlying upper fin material (e.g., of the source and drain regions) to provide a tunnel diode configuration to help reduce or eliminate parasitic leakage (e.g., subthreshold leakage). For instance, in some embodiments, the subfin material may be intentionally p-type doped (e.g., with a doping concentration of at least 1E16, 5E16, 1E17, 5E17, 1E18, 5E18, or 1E19 atoms per cubic cm) if the overlying material is to be n-type doped, or vice versa.

Referring again to FIG. 4, the method 400 then proceeds from 404 to 408, where a dummy gate is formed over the fin comprising the alternating stack of sacrificial material 304 and nanowire material 104. FIG. 3B illustrates the device 100, with dummy gate 312 formed over the fin 302. ILD material 115 abuts the dummy gate 312 and defines the region where the dummy gate is to be formed. The dummy gate 312 may include dummy gate oxide and/or dummy gate electrode (e.g., poly-Si). For example, forming the dummy gate may involve deposition of a dummy gate oxide and deposition of a dummy gate electrode (e.g., poly-Si).

The method 400 of FIG. 4 then proceeds from 408 to 412, where the sacrificial material is selectively etched, to form cavities. FIG. 3C illustrates cavities 308 formed by etching the sacrificial material 304. In an example, a cavity 308 is defined by sidewalls of the sacrificial material 304 and a sidewall of the nanowire material 104. An appropriate etchant that selectively etches the sacrificial material 304 (e.g., comprising SiGe), without etching the nanowires 104 (e.g., comprising Si), may be used. An appropriate directional or anisotropic etching technique may be employed.

The method 400 of FIG. 4 then proceeds from 412 to 416, where source region and drain region are formed. For example, FIG. 3D illustrates the device 100, with source region 106 and drain region 108.

In a standard process flow, the source region 106 and drain region 108 are formed after formation of the gate spacers. In contrast, in the device 100, the source region 106 and drain region 108 are formed prior to formation of any gate spacer. Note that the source region 106 and drain region 108 protrudes within and fills the cavities 308. Thus, the source region 106 and drain region 108 are in direct contact with the sacrificial material 304.

As discussed, the epitaxial growth of the source region 106 and the drain region 108 is performed prior to the formation of the gate spacers 118a, 118b. Hence, the source and drain regions 106, 108 are grown adjacent to semiconductor material comprising sacrificial SiGe and Si of the nanowires. Hence, the source and drain regions 106, 108 can nucleate and grow relatively defect free, with lattice structure of the source/drain regions matched with that of the Si nanowires. This introduces adequate strain in the nanowires 104 of the device 100. The strained nanowires 104 of the device 100 increases carrier mobility of the nanowires 104, which in turn improves the performance of the device 100.

In an example, the source/drain regions may be formed using any suitable techniques, in accordance with an embodiment of the present disclosure. For example, forming the source and drain regions can be performed by etching at least a portion of exposed source and drain portion of the fins to remove the layer stack, and forming replacement source and drain material using any suitable techniques, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In some embodiments, the exposed source/drain regions of the fins need not be completely removed; instead, the material in the layer stack at the source/drain regions is converted to final source/drain regions by doping, implantation, and/or cladding with a source/drain material or other suitable processing, for example.

In some embodiments where adjacent NMOS and PMOS devices are to be formed, the source and drain regions may be formed one polarity at a time, such as performing processing for one of n-type and p-type regions, and then performing processing for the other of the n-type and p-type regions. In some embodiments, the source and drain regions may include any suitable doping scheme, such as including suitable n-type and/or p-type dopant (e.g., in a concentration in the range of 1E16 to 1E22 atoms per cubic cm). However, in some embodiments, at least one source or drain region may be undoped/intrinsic or relatively minimally doped, such as including a dopant concentration of less than 1E16 atoms per cubic cm, for example. As discussed, the source region 106 and drain region 108 are formed prior to formation of any gate spacer, and the source region 106 and drain region 108 protrudes within and fills the cavities 308.

The method 400 of FIG. 4 then proceeds from 416 to 420, where the nanowires are released. For example, FIG. 3E illustrates the device 100, with the nanowires 104 released. Releasing the nanowires may begin with removing the dummy gate electrode 312 (see FIG. 3D), to expose the channel region of the fin. For example, a polycrystalline silicon dummy gate electrode can be removed using a wet etch process (e.g., nitric acid/hydrofluoric acid), an anisotropic dry etch, or other suitable etch process, as will be appreciated. At this stage of processing, the layer stack of alternating layers of nanowire material and sacrificial material is exposed in the channel region.

The sacrificial material 304 in the layer stack can then be removed by etch processing, in accordance with some embodiments. Etching the sacrificial material may be performed using any suitable wet or dry etching process such that the etch process selectively removes the sacrificial material and leaves intact the channel nanowire material. In one embodiment, the sacrificial material is silicon germanium (SiGe) and the channel material is electronic grade silicon (Si). For example, a gas-phase etch using an oxidizer and hydrofluoric acid (HF) has shown to selectively etch SiGe in SiGe/Si layer stacks. In another embodiment, a gas-phase chlorine trifluoride (ClF3) etch is used to remove the sacrificial SiGe material. The etch chemistry can be selected based on the germanium concentration, nanowire dimensions, and other factors, as will be appreciated. After removing the SiGe sacrificial material, the resulting channel region includes silicon nanowires 104 extending between the source and drain regions, where the tip regions of the nanowires (e.g., silicon) contact the source and drain regions.

Referring again to FIG. 4, the method 400 then proceeds from 420 to 424, where inner walls of the source and drain regions (e.g., that are exposed through the channel region) are selectively oxidized, to form the gate spacers. For example, FIG. 3F illustrates the inner walls of the source region 106 and the drain region 108 oxidized, to respectively form the gate spacers 118a and 118b.

The inner walls of the source and drain regions 106, 108 are labelled in FIG. 3E. Inner wall of the source region 106 faces the nanowires 104 and the drain region 108. Similarly, inner wall of the drain region 108 faces the nanowires 104 and the source region 106. As illustrated in FIG. 3E, the inner walls of the source and drain regions are exposed through the channel region, due to the removal of the dummy gate and the sacrificial material 304. The oxidation of the inner walls of the source and drain regions is performed through the opening in the channel region.

In an example, the oxidation is performed in oxygen rich ambient, using an annealing process. In an example, the temperature is maintained in the range of 450 to 500° C. for, for example, 5 to 60 minutes. In an example, the source and drain regions comprise SiGe, whereas the nanowires 104 comprise Si. Also, SiGe oxidizes at a lower temperature than Si. For example, the temperature during the anneal process of 424 is maintained at 450 to 500° C., which causes oxidation of the SiGe of the exposed section of the inner walls of the source and drain regions. Thermal oxidation of silicon is usually performed at a temperature between 800 and 1200° C. Thus, the oxidation process of the SiGe at 450-500° C. does not oxidize the Si of the nanowires 104.

As a result of the oxidation, the SiGe of the exposed inner walls of the source and drain regions 106, 108 becomes Silicon Germanium Oxide (SiGeO). For example, the SiGe of the source/drain regions 106, 108, which are within the cavity 308 (see FIG. 3C for cavities 308), are at least in part transformed to SiGeO. The thus formed SiGeO act as gate spacers, separating the source and drain regions 106, 108 from the gate electrode (that is to be formed later). Sections of the inner walls of the source and drain regions, which are coupled to the nanowires 104, and not oxidized (e.g., protected by the nanowires 104 during oxidation).

Thus, the gate spacers 118a, 118b are formed by oxidation of corresponding inner walls of the source and drain regions 106, 108, respectively, and hence, the gate spacers 118a, 118b comprise SiGeOx. Selective oxidation of the inner walls of the source and drain regions 106, 108 results in the gate spacers 118a, 118b having a relatively low-k spacer material for the gate spacers 118a, 118b. For example, the gate spacers 118a, 118b have a dielectric constant in the range of about 3.9 to about 4.5.

The method 400 of FIG. 4 then proceeds from 424 to 428, where the final gate stack is formed. For example, FIG. 3G illustrates the device 100, with the gate stack formed, where the gate stack comprises gate dielectric 112 wrapped around middle regions of individual nanowires 104, and the gate electrode 116 around the gate dielectric 112. In this example embodiment, the gate stack is formed using a gate-last fabrication flow, which may be considered a replacement gate or replacement metal gate (RMG) process. In embodiments utilizing a nanowire channel structure, the gate stack may substantially (or completely) surround each nanowire middle region portion, such as wrapping around at least 80, 85, 90, 95% or more of each nanowire. Processing the final gate stack includes depositing gate dielectric 112 on the exposed nanowire middle region in the channel region, followed by formation of a gate electrode 116 in contact with the gate dielectric 112. Any suitable technique can be used, including spin-coating or CVD deposition, for example. The gate dielectric may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric can be annealed to improve its quality when high-k dielectric material is used. The gate electrode may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric and/or gate electrode may include a multilayer structure of two or more material layers, for example. For instance, in some embodiments, a multilayer gate dielectric may be employed to provide a more gradual electric transition from the channel region to the gate electrode, for example. In some embodiments, the gate dielectric and/or gate electrode may include grading (e.g., increasing and/or decreasing) the content or concentration of one or more materials in at least a portion of the feature(s). In some embodiments, one or more additional layers may also be present in the final gate stack, such as one or more relatively high or low work function layers and/or other suitable layers. Note that the gate dielectric may also be used to form replacement gate spacers on one or both sides of the nanowire body, such that the gate dielectric is between the gate electrode and one or both gate spacers, for example. Numerous different gate stack configurations will be apparent in light of this disclosure.

The method 400 of FIG. 4 then proceeds from 428 to 432, where source/drain contacts are formed. FIG. 3H illustrates the device 100, with source/drain contacts 320 formed. Note that FIG. 1A does not illustrate the source/drain contacts 320. FIG. 1A illustrates the device 100 of FIG. 3G, while FIG. 1E illustrates the device 100 of FIG. 3H. Also, in FIG. 3H, an appropriate ILD 318 is deposited over the device 100, and the source/drain contacts 320 are formed through the ILD 318. Also illustrated is the gate contact 324 through the ILD 318.

In some embodiments, the source and drain contacts can be formed using any suitable techniques, such as forming contact trenches in the ILD layer 318 over the respective source/drain regions, and then depositing metal or metal alloy (or other suitable electrically conductive material) in the trenches. In some embodiments, forming the source/drain contacts may include silicidation, germanidation, III-V-idation, and/or annealing processes, for example. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance reducing layer may be present between a given source or drain region and its corresponding source or drain contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region, for example.

The method 400 of FIG. 4 then proceeds from 432 to 436, where a general integrated circuit (IC) is completed, as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure.

Note that the processes in method 400 are shown in a particular order for ease of description. However, one or more of the processes may be performed in a different order or may not be performed at all (and thus be optional), in accordance with some embodiments. Numerous variations on method 400 and the techniques described herein will be apparent in light of this disclosure.

FIGS. 5A-5D illustrate cross-sectional views of an example nanowire semiconductor device (e.g., the nanowire semiconductor device 200 of FIGS. 2A and 2B) in various stages of processing, in accordance with an embodiment of the present disclosure. FIG. 6 illustrates a flowchart depicting a method 600 of forming the example nanowire semiconductor device of FIGS. 5A-5D, in accordance with an embodiment of the present disclosure. FIGS. 5A-5D and 6 will be discussed in unison. For clarity of illustration, not all structures of the device 200 and not all stages of processing are shown.

Referring to the method 600 of FIG. 6, operations at blocks 604, 608, 612, 616, and 620 are respectively similar to the operations at operations at blocks 504, 508, 512, 516, and 520 of the method 400 of FIG. 4. Accordingly, operations at blocks 604, 608, 612, 616, and 620 of the method 600 are not discussed in further detail. Releasing the nanowires at block 620 results in the device 200 of FIG. 5A, which is similar to the device 100 of FIG. 3E. Formation of the device 200 of FIG. 5A would be apparent, based on the discussion with respect to formation of the device 100 of FIG. 3E.

Figure 5A:
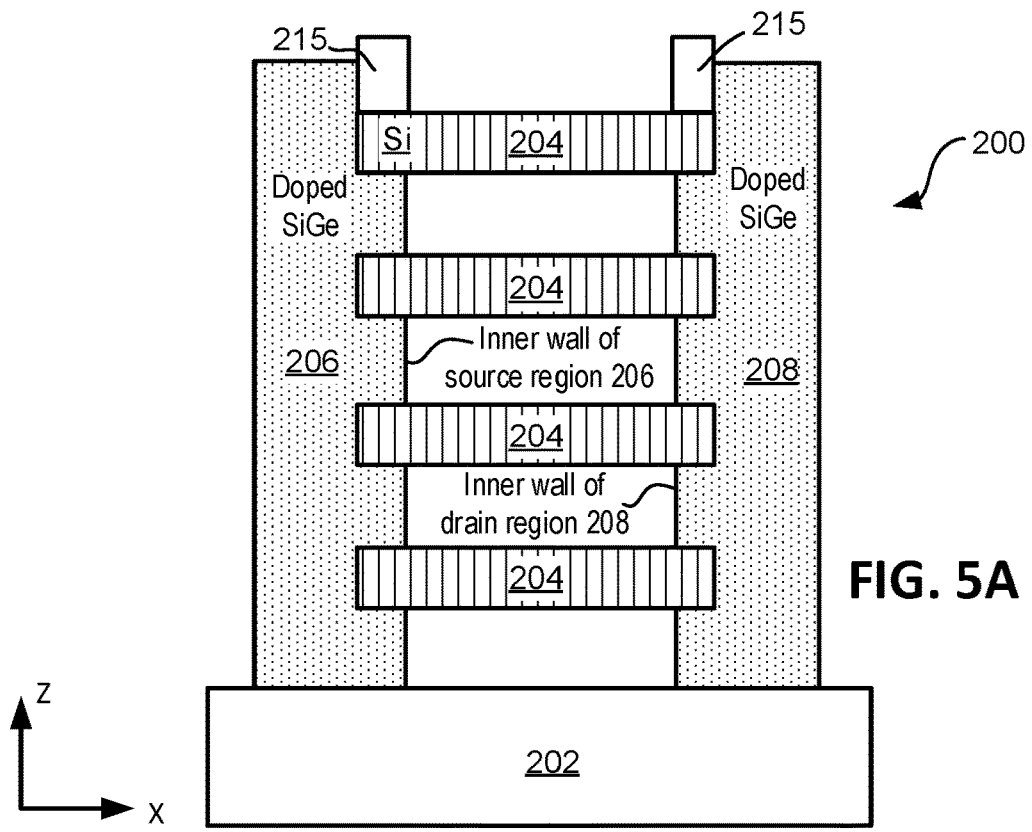
FIGS. 5A-5D illustrate cross-sectional views of an example nanowire semiconductor device in various stages of processing, where the nanowire semiconductor device has gate spacers formed by condensation annealing of inner walls of source region and drain region, in accordance with an embodiment of the present disclosure.
Figure 5B:
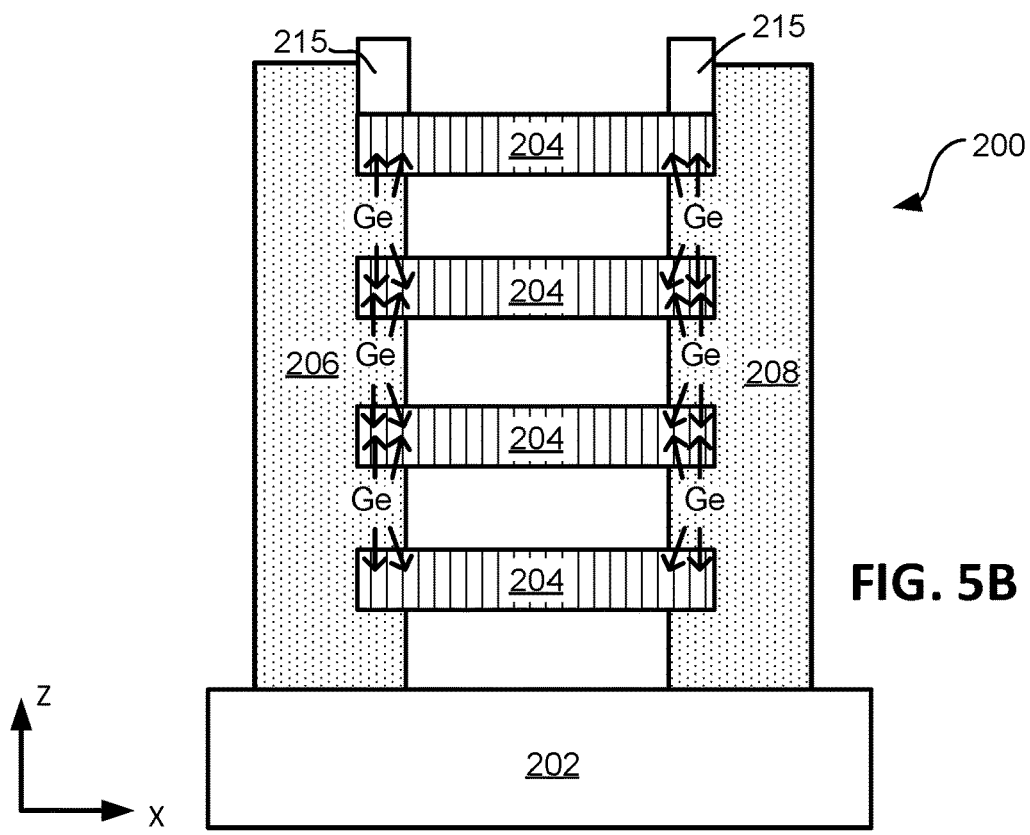
Figure 6:
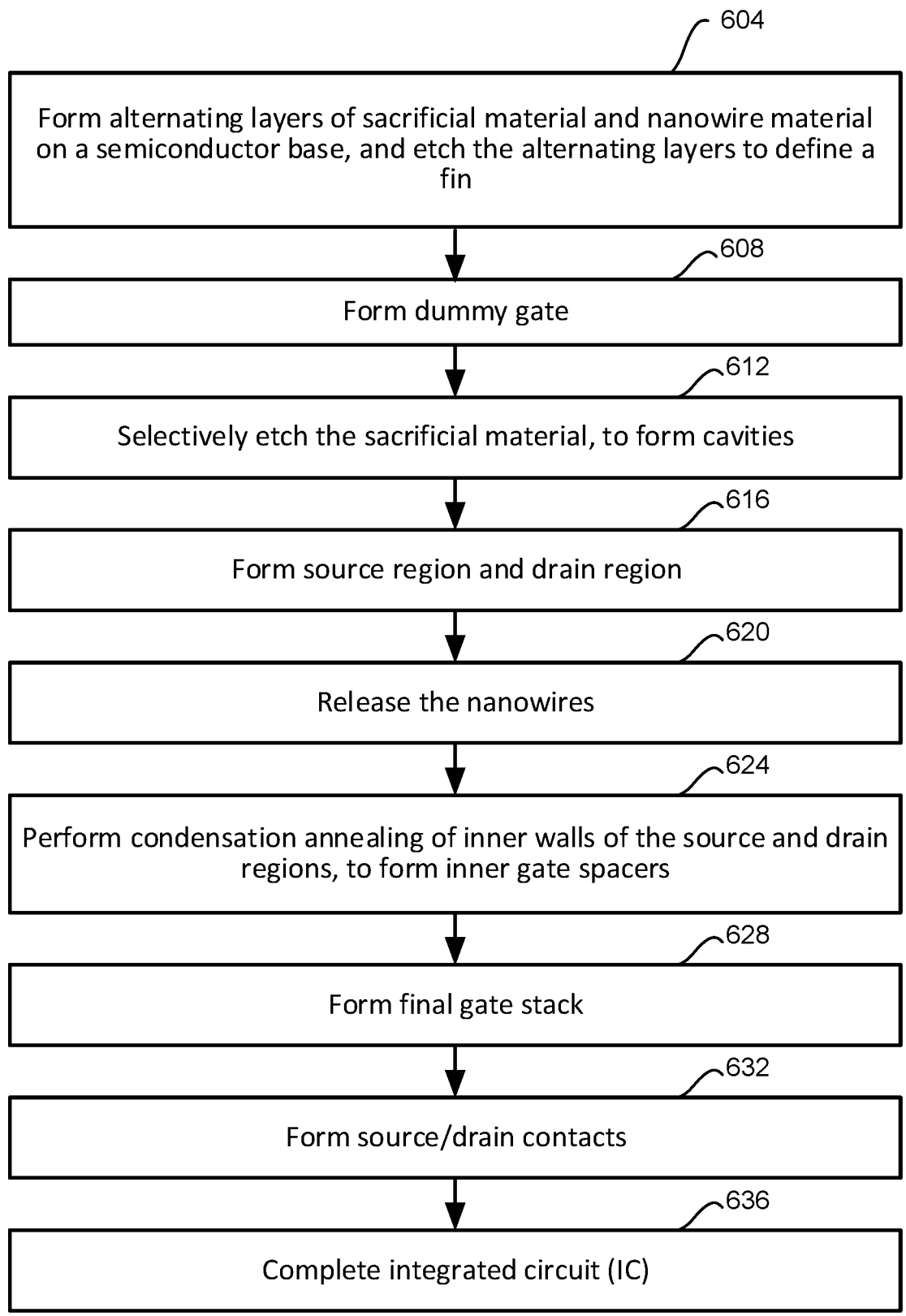
FIG. 6 illustrates a flowchart depicting a method of forming the example nanowire semiconductor device of FIGS. 5A-5D, in accordance with an embodiment of the present disclosure.

As discussed with respect to FIG. 3E, the device 200 of FIG. 5A includes the doped SiGe source region 206 and the drain region 208, and the Si nanowires 204. In FIG. 5A, the source and drain regions 206, 208 wraps around the tip regions of the nanowires 204. Also labelled in FIG. 5A are the inner walls of the source region 206 and the drain region 208.

Referring again to FIG. 6, the method 600 proceeds from 620 to 624. At 624, condensation annealing of inner walls of the source and drain regions are performed, to form gate spacers 218a, 218b.

The condensation of inner walls of the source region 206 and drain regions 208 is performed within an oxygen rich ambient, and the temperature is maintained in the range of 800 to 950° C. In one example, the condensation process is performed for a duration of about 1-3 milliseconds. In one example, the condensation process is performed for a duration of less than 5 milliseconds.

During the condensation process, the exposed sections of the inner walls of the source and drain region 206, 208 (i.e., the sections of the inner walls not covered by the nanowires 204) are at a high temperature of 800-950° C. and are at least partly melted, thereby allowing the Ge of the SiGe source/drain region to move around. Due to gradient difference of the Ge between the inner walls of the source/drain regions and the nanowires 204, the free Ge of the inner walls move to the Si nanoribbons 104, as illustrated by the arrows in FIG. 5B. This results in the Si tip regions of the nanowires 204 to receive the Ge from the inner walls. Note that significant amount of Ge may not travel to the middle region of the nanowires 204. This results in creation of graded concentration of Ge in the nanowire 204, as discussed with respect to FIGS. 2A and 2A1. Accordingly, the inner walls of the source and drain regions 206, 208 now includes Si and some amount of Ge (after migration of some Ge to the nanowires 204). Subsequently, the Si and the Ge in the inner D walls transform to SiO2, along with some GeO2 and SiGeO. This will create the gate spacers 218a, 218b (i.e., by transforming the SiGe inner wall to SiO2, GeO2, and SiGeO), as illustrated in FIG. 5C.

Figure 5C:
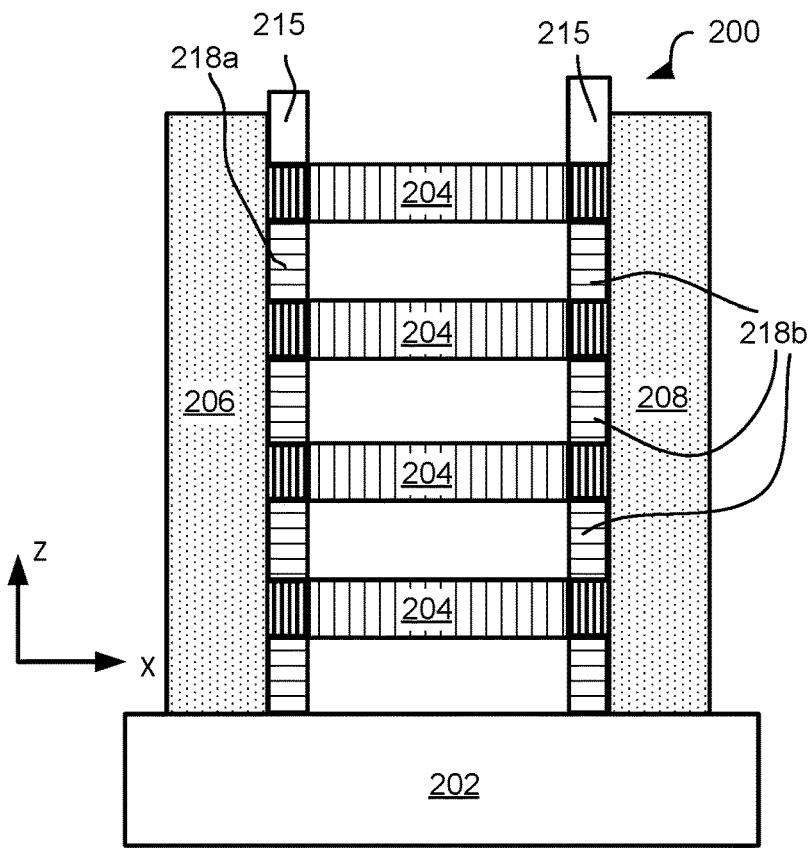

Thus, as also discussed with respect to FIGS. 2A and 2A1, in the device 200 of FIG. 5C, the nanowire middle region and the nanowire tip regions of individual nanowires 204 are compositionally different. For example, the nanowire middle region comprises Si, and the nanowire tip regions comprises Si and Ge (e.g., where the Ge of the tip regions migrates from the inner wall to the tip region during the above discussed condensation process). In an example, a concentration of Ge is graded from the tip regions to the middle region, with higher concentration of Ge in the tip regions 204b to a lower concentration of Ge in the middle region 204a. In a central section of the middle region 204a (e.g., that is about equidistance from the two tip regions 204b), the concentration of Ge is zero. In an example, the tip regions of the nanowires have about 35 to 45% Ge. In an example, sections of the tip regions 204b, which are adjacent to the gate spacer 218a or 218b, have higher Ge concentration compared to a central section of the tip region that is further from the corresponding gate spacer (e.g., see FIG. 2A1), due to the migration of the Ge from the inner walls to the tip regions. As also discussed, the gate spacers 218a, 218b comprise SiO2 and SiGeOx. In an example, a concentration of Ge (e.g., 55 to 60%) in the source and drain regions 106, 108 may be higher than a concentration of Ge (e.g., 5 to 15%) in the gate spacers 218a, 218b.

In an example, the gate spacers 218a, 218b comprising SiO2 and SiGeOx have a relatively low-k. For example, the gate spacers 218a, 218b have a dielectric constant in the range of about 3.9 to about 4.2. In contrast, gate spacers comprising silicon nitride have a relative high dielectric constant in the range of 4.8 to 7. Because the gate spacers 218a, 218b have relatively low dielectric constant (e.g., compared to silicon nitride gate spacers), parasitic capacitance of the gate spacers 218a, 218b is relatively low (e.g., compared to transistors including silicon nitride gate spacers), which increases switching performance of the device 200.

Figure 5D:
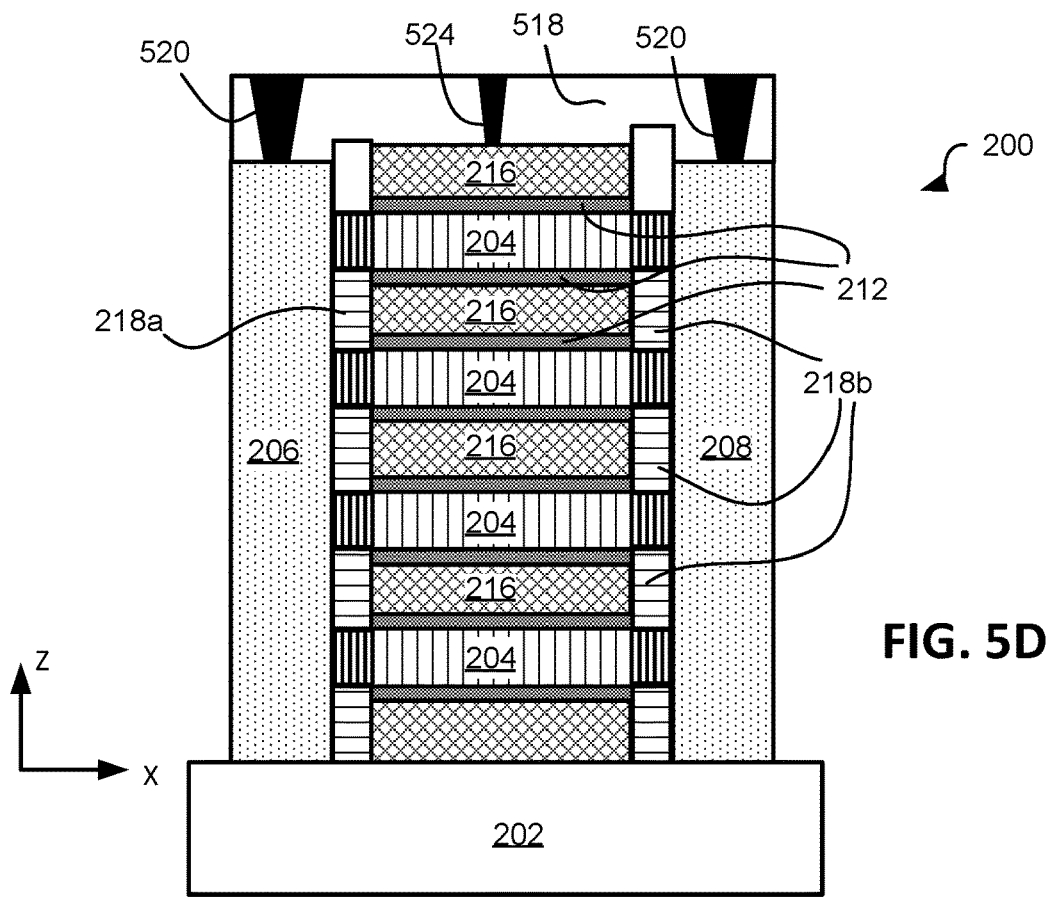

Referring again to FIG. 6, the method 600 then proceeds from 624 to 628. The operations at blocks 628, 632, and 636 are respectively similar to the operations at operations at blocks 528, 532, and 536 of the method 400 of FIG. 4. Accordingly, operations at blocks 628, 632, and 636 of the method 600 are not discussed in further detail. FIG. 5D illustrates a final structure of the device 200, with source and drain contacts 520 and gate contact 524 extending through an ILD layer 518, which are formed during operations 632 of the method 600 of FIG. 6.

Figure 7:
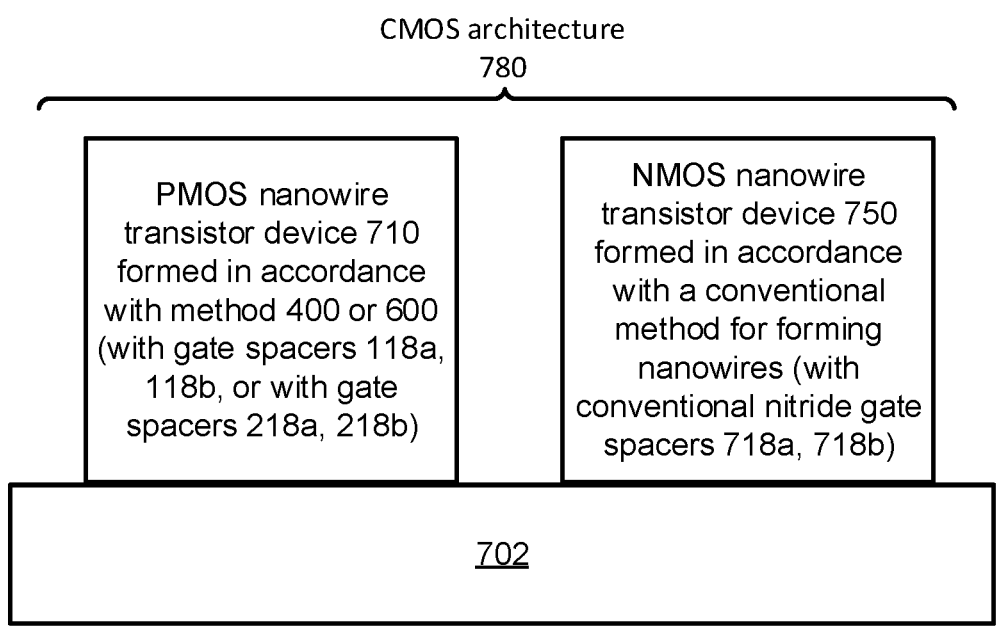
FIG. 7 illustrates a complementary metal-oxide-semiconductor (CMOS) architecture comprising (i) a PMOS nanowire transistor device formed in accordance with the method of FIG. 4 or the method of FIG. 6, and (ii) a NMOS nanowire transistor device, in accordance with an embodiment of the present disclosure.

FIG. 7 schematically illustrates a complementary metal-oxide-semiconductor (CMOS) architecture comprising (i) a PMOS nanowire transistor device 710 formed in accordance with method 400 of FIG. 4 (i.e., having gate spacers 118*a*, 118*b*) or method 600 of FIG. 6 (i.e., having gate spacers 218*a*, 218*b*), and (ii) a NMOS nanowire transistor device 750, in accordance with an embodiment of the present disclosure. The NMOS nanowire transistor has nitride gate spacers 718*a*, 718*b* and can be formed, for example, using standard or proprietary processing. The PMOS and NMOS transistors are symbolically illustrated in FIG. 7, but the internal structures of the two transistors will be readily appreciated in light of the other Figures provided herein.

The PMOS nanowire transistor device 710 (also referred to herein as "PMOS device 710") is similar to any of the device 100 or 200 discussed throughout this disclosure. For example, in the PMOS device 710, the source and drain regions are formed prior to formation of the gate spacers. The gate spacers (e.g., comprising Si, Ge, and O) are formed from the inner walls of the source and drain regions. Accordingly, for at least the reasons discussed throughout this disclosure, the nanowires of the PMOS device 710 are strained.

In contrast, the NMOS nanowire transistor device 750 (also referred to as NMOS device 750) can be formed in accordance with any standard or proprietary method for forming NMOS nanowire transistors. For example, in the NMOS device 750, the source and drain regions are formed subsequent to formation of the gate spacers 718*a*, 718*b*. The gate spacers 718*a*, 178*b* may comprise, for example, an appropriate nitride, such as silicon nitride. In contrast to the PMOS device 710, the gate spacers 718*a*, 178*b* of the NMOS device 750 lacks any Ge. Similarly, in contrast to the PMOS device 710, tip regions of the nanowires of the NMOS device 750 lack any Ge. Furthermore, for at least the reasons discussed throughout this disclosure, the nanowires of the NMOS device 710 are relatively less strained (e.g., compared to the strain of the PMOS device).

It may be noted that in a CMOS architecture (such as the CMOS architecture 780 of FIG. 7 comprising the NMOS and PMOS devices), loss of strain in nanowires affects a PMOS device more than an NMOS device, as loss in strain in nanowires adversely affects movement of holes more than movement of electrons. However, in the CMOS architecture 780, the nanowires of the PMOS device 710 are at a higher strain than the NMOS device 750, thereby leading to performance matching in the PMOS and NMOS devices.

Example System

Figure 8:
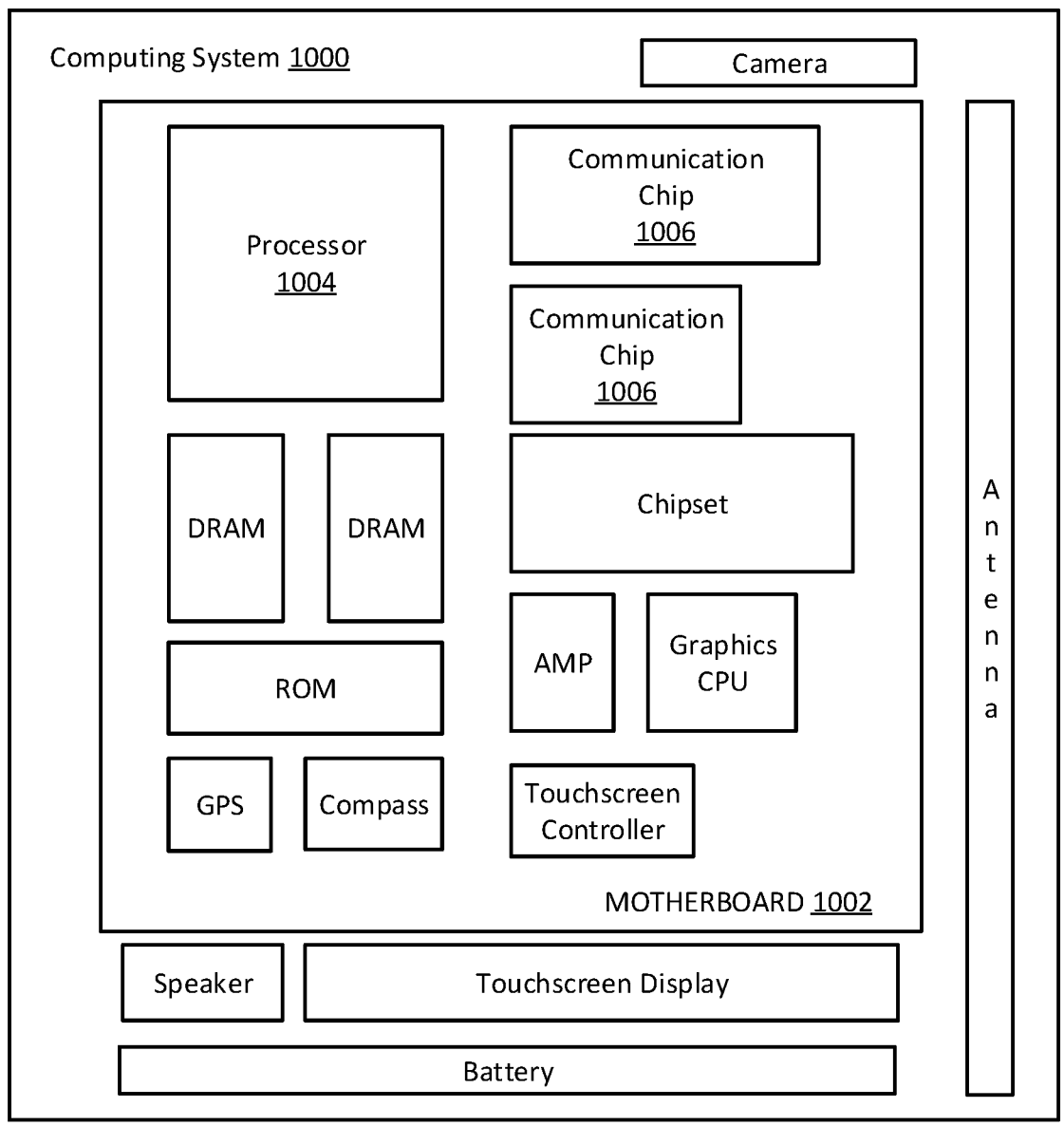
FIG. 8 illustrates a computing system implemented with integrated circuit structures and/or transistor devices formed using the techniques disclosed herein, in accordance with some embodiments of the present disclosure.

FIG. 8 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following clauses pertain to further embodiments, from which numerous permutations and configurations will be apparent.

Example 1. A semiconductor structure comprising: a body comprising a semiconductor material; a gate structure at least in part wrapped around the body, the gate structure including (i) a gate electrode and (ii) a gate dielectric between the body and the gate electrode; a source region and a drain region, the body between the source and drain regions; and a first spacer between the source region and the gate electrode, and a second spacer between the drain region and the gate electrode, wherein the first and second spacers comprise germanium and oxygen.

Example 2. The semiconductor structure of example 1, wherein: the body comprises a first tip region in contact with the source region, a second tip region in contact with the drain region, and a middle region between the first tip region and the second tip region; and the middle region comprises silicon, and the first and second tip regions comprise silicon and germanium.

Example 3. The semiconductor structure of example 2, wherein: a central section of the middle region laterally between the first and second tip regions comprises essentially silicon and is free of germanium.

Example 4. The semiconductor structure of any one of examples 2-3, wherein: the source region and the drain region comprise germanium; and a concentration of germanium in the source and drain regions is higher than a concentration of germanium in the first and second tip regions of the body.

Example 5. The semiconductor structure of any one of examples 2-4, wherein: the first tip region has a first surface and a second surface abutting the first spacer, and a central section that is laterally between the first and second surfaces; and germanium in the first tip region is graded from a first concentration near the first surface to a second concentration near the central section and to a third concentration near the second surface, wherein the first and third concentrations are higher than the second concentration.

Example 6. The semiconductor structure of any one of examples 2-5, wherein: the first tip region has a first surface and a second surface abutting the first spacer, and a central section that is laterally between the first and second surfaces; and concentrations of germanium in the first tip region near the first and second surfaces are higher than a concentration of germanium at the central section of the first tip region.

Example 7. The semiconductor structure of any one of examples 2-6, wherein: the first tip region has a first surface and a second surface abutting the first spacer; and concentrations of germanium in the first tip region near the first and second surfaces are higher than a concentration of germanium in the first spacer.

Example 8. The semiconductor structure of any one of examples 2-7, wherein: the first spacer wraps around at least a part of the first tip region, the second spacer wraps around at least a part of the second tip region, and the gate electrode and the gate dielectric wraps around at least a part of the middle region.

Example 9. The semiconductor structure of example 1, wherein: the source region and the drain region comprise germanium; and a concentration of germanium in the source and drain regions is same as a concentration of germanium in the first and second spacers.

Example 10. The semiconductor structure of any one of examples 1-9, wherein the source and drain regions comprise silicon and germanium and are strain-inducing with respect to the body.

Example 11. The semiconductor structure of any one of examples 1-10, wherein the first and second spacers further comprise silicon, and are free of nitrogen.

Example 12. The semiconductor structure of any one of examples 1-11, wherein the body is a nanowire, a nanoribbon, or a nanosheet.

Example 13. The semiconductor structure of any one of examples 1-12, wherein the body is part of a vertical stack including two or more nanowires.

Example 14. The semiconductor structure of any one of examples 1-13, wherein the body is a first body, and wherein the semiconductor structure further comprises: one or more additional bodies comprising semiconductor material and between the source and drain regions.

Example 15. The semiconductor structure of any one of examples 1-14, wherein the semiconductor structure is a 3-D transistor.

Example 16. The semiconductor structure of any one of examples 1-15, wherein the semiconductor structure is a gate-all-around transistor.

Example 17. The semiconductor structure of any one of examples 1-16, wherein the semiconductor structure is a forksheet transistor.

Example 18. The semiconductor structure of any one of examples 1-17, wherein the semiconductor structure is a PMOS transistor.

Example 19. An integrated circuit structure comprising: a body comprising a semiconductor material; a gate structure at least in part wrapped around the body, the gate structure including (i) a gate electrode and (ii) a gate dielectric between the body and the gate electrode; and a source region and a drain region, the body being between the source and drain regions, wherein the body comprises a first tip region, a second tip region, and a middle region between the first tip region and the second tip region, and wherein the middle region comprises silicon, and the first and second tip regions comprise silicon and germanium.

Example 20. The integrated circuit structure of example 19, wherein a central section of the middle region laterally between the first and second tip regions comprises silicon and is free of germanium, and the first and second tip regions comprise silicon and germanium.

Example 21. The integrated circuit structure of example 19, wherein a central section of the middle region laterally between the first and second tip regions essentially comprises silicon, and the first and second tip regions comprise silicon and germanium.

Example 22. The integrated circuit structure of any one of examples 19-21, wherein: the source region and the drain region comprise germanium; and a concentration of germanium in the source and drain regions is higher than a concentration of germanium in the first and second tip regions of the body.

Example 23. The integrated circuit structure of any one of examples 19-22, further comprising: a first spacer between the gate structure and the source region, and a second spacer between the gate structure and the drain region, wherein the first and second spacers comprise silicon, germanium, and oxygen.

Example 24. The integrated circuit structure of example 23, wherein the first and second spacers are free of nitrogen.

Example 25. The integrated circuit structure of any one of examples 23-24, wherein: the first tip region has a first surface and a second surface abutting the first spacer, and a central section that is laterally between the first and second surfaces; and germanium in the first tip region is graded from a first concentration near the first surface to a second concentration near the central section and to a third concentration near the second surface, wherein the first and third concentrations are higher than the second concentration.

Example 26. The integrated circuit structure of any one of examples 23-25, wherein: the first tip region has a first surface and a second surface abutting the first spacer, and a central section that is laterally between the first and second surfaces; and concentrations of germanium in the first tip region near the first and second surfaces are higher than a concentration of germanium at the central section of the first tip region.

Example 27. The integrated circuit structure of any one of examples 23-26, wherein: the first tip region has a first surface and a second surface abutting the first spacer, and a central section that is laterally between the first and second surfaces; and concentrations of germanium in the first tip region near the first and second surfaces are higher than a concentration of germanium in the first spacer.

Example 28. The integrated circuit structure of any one of examples 23-27, wherein: the first spacer wraps around at least a part of the first tip region, the second spacer wraps around at least a part of the second tip region, and the gate electrode and the gate dielectric wraps around at least a part of the middle region.

Example 29. The integrated circuit structure of any one of examples 19-28, wherein the first tip region in contact with the source region, and the second tip region is in contact with the drain region.

Example 30. A semiconductor structure comprising: a substrate; a P-channel metal-oxide-semiconductor (PMOS) transistor on the substrate, the PMOS transistor comprising a first body comprising a semiconductor material, a first gate structure at least in part wrapped around the first body, a first source region and a first drain region, and a first spacer between the first source region and the first gate structure, and a second spacer between the first drain region and the gate structure; and a N-channel metal-oxide-semiconductor (NMOS) transistor on the substrate, the NMOS transistor comprising a second body comprising a semiconductor material, a second gate structure at least in part wrapped around the second body, a second source region and a second drain region, and a third spacer between the second source region and the second gate structure, and a fourth spacer between the second drain region and the second gate structure, wherein the first and second spacers comprise germanium, silicon, and oxygen, and are free of nitrogen, and wherein the third and fourth spacers comprise silicon and nitrogen and are free of germanium.

Example 31. The semiconductor structure of example 30, further comprising: a complementary metal-oxide-semiconductor (CMOS) circuit including the PMOS transistor and the NMOS transistor.

Example 32. The semiconductor structure of any one of examples 30-31, wherein the first body is between the first source and first drain regions, and the second body is between the second source and second drain regions.

Example 33. The semiconductor structure of any one of examples 30-32, wherein: the first body comprises (i) a first tip region comprising silicon and germanium, (ii) a second tip region comprising silicon and germanium, and (iii) a middle region between the first tip region and the second tip region, the middle region comprising silicon; and the second body comprises silicon and is free of germanium.

Example 34. A method of forming a semiconductor device, comprising: forming a vertical stack of alternating layers of sacrificial material and semiconductor material; forming a dummy gate over the vertical stack; forming a source region and a drain region, the vertical stack laterally between the source region and the drain region, wherein an inner wall of the source region is in contact with the vertical stack and an inner wall of the drain region is in contact with the vertical stack; removing the sacrificial material, thereby (i) exposing at least a part of the inner walls of the source and drain regions and (ii) releasing the semiconductor material; and processing the inner walls of the source and drain regions, to transform at least the part of the inner wall of the source region to a first spacer and to transform at least the part of the inner wall of the drain region to a second spacer.

Example 35. The method of example 34, wherein processing the inner walls of the source and drain regions comprises: oxidizing at least the part of the inner wall of the source region and at least the part of the inner wall of the drain region.

Example 36. The method of example 35, wherein processing the inner walls of the source and drain regions comprises: oxidizing at a temperature in the range of 450 to 500° C. and for a time period that ranges between 5 to 60 minutes.

Example 37. The method of any one of examples 34-36, wherein processing the inner walls of the source and drain regions comprises: performing condensation of at least the part of the inner wall of the source region and at least the part of the inner wall of the drain region.

Example 38. The method of any one of examples 34-37, wherein performing the condensation comprises: performing the condensation at a temperature in the range of 800 to 950° C. and for less than 20 milliseconds.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor structure comprising:
a body comprising a semiconductor material;
a gate structure at least in part wrapped around the body, the gate structure including (i) a gate electrode and (ii) a gate dielectric between the body and the gate electrode;
a source region and a drain region, the body extending between the source and drain regions along a first direction; and
a first spacer between the source region and the gate electrode along the first direction, and a second spacer between the drain region and the gate electrode along the first direction, wherein the first and second spacers comprise germanium and oxygen,
wherein the body comprises a first tip region in contact with the source region and between portions of the first spacer along a second direction orthogonal to the first direction, a second tip region in contact with the drain region and between portions of the second spacer along the second direction, and a middle region between the first tip region and the second tip region along the first direction, and
wherein the first tip region has first and second surfaces abutting the first spacer, and a central section that is between the first and second surfaces along the second direction, and a first concentration of germanium in the first tip region near the first surface and a second concentration of germanium in the first tip region near the second surface are both higher than a third concentration of germanium at the central section of the first tip region.

2. The semiconductor structure of claim 1, wherein:
the middle region comprises silicon, and the first and second tip regions comprise silicon and germanium.

3. The semiconductor structure of claim 1, wherein:
a central section of the middle region laterally between the first and second tip regions comprises essentially silicon and is free of germanium.

4. The semiconductor structure of claim 2, wherein:
the source region and the drain region comprise germanium; and
a fourth concentration of germanium in the source and drain regions is higher than the first, second, and third concentrations of germanium.

5. The semiconductor structure of claim 2, wherein:
germanium in the first tip region is graded from the first concentration near the first surface to the third concentration at the central section and from the second concentration near the second surface to the third concentration at the central section.

6. The semiconductor structure of claim 2, wherein:
the first and second concentrations of germanium in the first tip region near the first and second surfaces are higher than a fourth concentration of germanium in the first spacer.

7. The semiconductor structure of claim 1, wherein:
the first spacer wraps around at least a part of the first tip region, the second spacer wraps around at least a part of the second tip region, and the gate electrode and the gate dielectric wraps around at least a part of the middle region.

8. The semiconductor structure of claim 1, wherein:
the source region and the drain region comprise germanium; and
a concentration of germanium in the source and drain regions is the same as a concentration of germanium in the first and second spacers.

9. The semiconductor structure of claim 1, wherein the source and drain regions comprise silicon and germanium and are strain-inducing with respect to the body.

10. The semiconductor structure of claim 1, wherein the first and second spacers further comprise silicon, and are free of nitrogen.

11. The semiconductor structure of claim 1, wherein the body is part of a vertical stack including two or more nanowires, nanoribbons, or nanosheets.

12. The semiconductor structure of claim 1, wherein the semiconductor structure is a PMOS transistor.

13. An integrated circuit structure comprising:
a body comprising a semiconductor material;
a gate structure at least in part wrapped around the body, the gate structure including (i) a gate electrode and (ii) a gate dielectric between the body and the gate electrode;
a source or drain region, the body extending from the source or drain region along a first direction; and
a spacer between the source or drain region and the gate electrode along the first direction;
wherein the body comprises a first tip region, a second tip region, and a middle region between the first tip region and the second tip region along the first direction, the first tip region being in contact with the source or drain region, and
wherein the first tip region has first and second surfaces abutting the spacer along a second direction orthogonal to the first direction, and a central section that is between the first and second surfaces along the second direction, and a first concentration of germanium in the first tip region near the first surface and a second concentration of germanium in the first tip region near the second surface are both higher than a third concentration of germanium at the central section of the first tip region.

14. The integrated circuit structure of claim 13, wherein a central section of the middle region laterally between the first and second tip regions comprises silicon and is free of germanium, and the first and second tip regions comprise silicon and germanium.

15. The integrated circuit structure of claim 14, wherein:
the source or drain region comprises a fourth concentration of germanium; and
the fourth concentration of germanium is higher than the first, second, and third concentrations of germanium.

16. The integrated circuit structure of claim 15, further comprising:
wherein the spacer comprises silicon, germanium, and oxygen.

17. A semiconductor structure comprising:
a substrate;
a P-channel metal-oxide-semiconductor (PMOS) transistor on the substrate, the PMOS transistor comprising
a first body comprising a semiconductor material,
a first gate structure at least in part wrapped around the first body,
a first source region and a first drain region, the first body extending between the first source and first drain regions along a first direction, and
a first spacer between the first source region and the first gate structure along the first direction, and a second spacer between the first drain region and the first gate structure along the first direction, wherein the first body comprises a first tip region in contact with the first source region, a second tip region in contact with the first drain region, and a middle region between the first tip region and the second tip region along the first direction, and wherein the first tip region has first and second surfaces abutting the first spacer along a second direction orthogonal to the first direction, and a central section that is between the first and second surfaces along the second direction, and a first concentration of germanium in the first tip region near the first surface and a second concentration of germanium in the first tip region near the second surface are both higher than a third concentration of germanium at the central section of the first tip region; and a N-channel metal-oxide-semiconductor (NMOS) transistor on the substrate, the NMOS transistor comprising a second body comprising a semiconductor material, a second gate structure at least in part wrapped around the second body, a second source region and a second drain region, the second body extending between the second source and drain regions along the first direction, and a third spacer between the second source region and the second gate structure along the first direction, and a fourth spacer between the second drain region and the second gate structure along the first direction.

18. The semiconductor structure of claim 17, wherein:

the first tip region comprises silicon and germanium, the second tip region comprises silicon and germanium, and the middle region comprises silicon; and the second body comprises silicon and is free of germanium.

19. The semiconductor structure of claim 17, further comprising:

a complementary metal-oxide-semiconductor (CMOS) circuit including the PMOS transistor and the NMOS transistor.

20. The semiconductor structure of claim 17, wherein the first and second spacers comprise germanium, silicon, and oxygen, and are free of nitrogen, and wherein the third and fourth spacers comprise silicon and nitrogen and are free of germanium.

\* \* \* \* \*